(12) United States Patent
Kim et al.

(10) Patent No.: US 9,330,743 B2
(45) Date of Patent: May 3, 2016

(54) MEMORY CORES OF RESISTIVE TYPE MEMORY DEVICES, RESISTIVE TYPE MEMORY DEVICES AND METHOD OF SENSING DATA IN THE SAME

(71) Applicants: Chan-Kyung Kim, Hwaseong-si (KR); Kee-Won Kwon, Seongnam-si (KR); Su-A Kim, Seongnam-si (KR); Chul-Woo Park, Yongin-si (KR); Jae-Youn Youn, Seoul (KR)

(72) Inventors: Chan-Kyung Kim, Hwaseong-si (KR); Kee-Won Kwon, Seongnam-si (KR); Su-A Kim, Seongnam-si (KR); Chul-Woo Park, Yongin-si (KR); Jae-Youn Youn, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/677,991

(22) Filed: Apr. 3, 2015

(65) Prior Publication Data

US 2015/0364178 A1 Dec. 17, 2015

(30) Foreign Application Priority Data

Jun. 16, 2014 (KR) .................... 10-2014-0072635

(51) Int. Cl.
| | | |
|---|---|---|
| *G11C 11/00* | (2006.01) | |
| *G11C 11/16* | (2006.01) | |
| *G11C 5/08* | (2006.01) | |
| *G11C 7/06* | (2006.01) | |
| *G11C 5/02* | (2006.01) | |
| *G11C 13/00* | (2006.01) | |
| *G11C 11/4091* | (2006.01) | |

(52) U.S. Cl.
CPC ............. *G11C 11/16* (2013.01); *G11C 5/025* (2013.01); *G11C 5/08* (2013.01); *G11C 7/065* (2013.01); *G11C 11/1653* (2013.01); *G11C 11/1673* (2013.01); *G11C 13/004* (2013.01); *G11C 13/0023* (2013.01); *G11C 11/4091* (2013.01); *G11C 2013/0042* (2013.01); *G11C 2213/79* (2013.01); *G11C 2213/82* (2013.01)

(58) Field of Classification Search
CPC .... G11C 11/16; G11C 7/065; G11C 11/4091; G11C 13/004; G11C 7/12; G11C 11/4094; G11C 11/2273; G11C 16/26
USPC .......................... 365/158, 148, 203, 207, 205
See application file for complete search history.

(56) References Cited

U.S. PATENT DOCUMENTS

| | | | |
|---|---|---|---|
| 6,614,682 B2 | 9/2003 | Hirai | |
| 7,016,220 B2 * | 3/2006 | Lee ....................... | G11C 11/14 365/158 |
| 8,531,864 B2 | 9/2013 | Kim | |
| 2013/0016557 A1 | 1/2013 | Kim | |
| 2013/0044534 A1 | 2/2013 | Kawai et al. | |
| 2013/0070516 A1 | 3/2013 | Tomotani et al. | |
| 2013/0176773 A1 | 7/2013 | Yuh et al. | |
| 2013/0258762 A1 | 10/2013 | Chih et al. | |
| 2013/0322154 A1 | 12/2013 | Youn et al. | |

* cited by examiner

*Primary Examiner* — David Lam
(74) *Attorney, Agent, or Firm* — Muir Patent Law, PLLC

(57) ABSTRACT

A memory core of a resistive type memory device includes at least a first resistive type memory cell coupled to a bit-line, a first resistance to voltage converter and a bit-line sense amplifier. The first resistance to voltage converter is coupled to the bit-line at a first node. The first resistance to voltage converter converts a resistance of the first resistive type memory cell to a corresponding voltage based on a read column selection signal. The bit-line sense amplifier is coupled to the bit-line at the first node and is coupled to a complementary bit-line at a second node. The bit-line sense amplifier senses and amplifies a voltage difference of the bit-line and the complementary bit-line in response to a sensing control signal.

20 Claims, 27 Drawing Sheets

MEMORY CORES OF RESISTIVE TYPE MEMORY DEVICES, RESISTIVE TYPE MEMORY DEVICES AND METHOD OF SENSING DATA IN THE SAME

CROSS-REFERENCE TO RELATED APPLICATION(S)

This U.S. non-provisional application claims the benefit of priority under 35 USC §119 to Korean Patent Application No. 10-2014-0072635, filed on Jun. 16, 2014, in the Korean Intellectual Property Office, the contents of which are incorporated herein in their entirety by reference.

BACKGROUND

1. Technical Field

This disclosure relates to memory devices, and more particularly to memory cores of resistive type memory devices, resistive type memory devices including the same, and methods of sensing data in resistive type memory devices.

2. Discussion of the Related Art

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Some examples of volatile memory devices include static random access memory (SRAM) and dynamic random access memory (DRAM). Some examples of nonvolatile memory devices include phase change random access memory (PRAM), resistive random access memory (RRAM), magnetic random access memory (MRAM), and ferroelectric random access memory (FRAM).

Researchers are continually seeking to improve various aspects of volatile and nonvolatile memory devices, such as integration density, operating speed, and reliability. However, as improvements are made to one aspect of a memory device, other aspects may be degraded. For instance, as operating speed is increased, reliability may decrease. Accordingly, there is a general need for new techniques to improve various memory characteristics concurrently.

SUMMARY

Some example embodiments may provide a memory core of a resistive type memory device, capable of enhancing performance while increasing integration rate.

Some example embodiments may provide a resistive type memory device including a resistance to voltage converter.

Some example embodiments may provide a method of sensing data in a resistive type memory device, capable of enhancing performance.

According to example embodiments, a memory core of a resistive type memory device includes a bit line, at least a first resistive type memory cell coupled to the bit-line at a first node, a first resistance to voltage converter, and a bit-line sense amplifier. The first resistance to voltage converter is coupled to the bit-line at the first node. The first resistance to voltage converter converts a resistance of the first resistive type memory cell to a corresponding voltage based on a read column selection signal. The bit-line sense amplifier is coupled to the bit-line at the first node and is coupled to a complementary bit-line at a second node. The bit-line sense amplifier senses and amplifies a voltage difference between the bit-line and the complementary bit-line in response to a sensing control signal.

In example embodiments, the first resistive type memory cell may include a magnetic tunnel junction (MTJ) element that has a first terminal coupled to the bit-line and a cell transistor. The cell transistor may have first electrode coupled to a second terminal of the MJT element, a gate terminal coupled to a word-line and a second electrode coupled to a source line.

In example embodiments, the first resistance to voltage converter may include a first n-channel metal oxide semiconductor (NMOS) transistor coupled to the bit-line, a third NMOS transistor coupled to a ground line and a second NMOS transistor coupled between the first NMOS transistor and the third NMOS transistor.

The first through third NMOS transistors may be coupled in series with respect to each other between the bit-line and the ground line. The first NMOS transistor may have a gate receiving the read column selection signal, the third NMOS transistor may have a gate receiving a bias voltage and the second NMOS transistor may be diode-connected.

The second NMOS transistor may operate in a saturation region when the first NMOS transistor is turned-on in response to the read column selection signal.

In example embodiments, the first resistance to voltage converter may include a first p-channel metal-oxide semiconductor (PMOS) transistor coupled to the bit-line, a third PMOS transistor coupled to a power supply line and a second PMOS transistor coupled between the first PMOS transistor and the third PMOS transistor.

The first through third PMOS transistors may be coupled in series with respect to each other between the bit-line and the power supply line. The first PMOS transistor may have a gate receiving an inverted version of the read column selection signal, the third PMOS transistor may have a gate receiving a bias voltage and the second PMOS transistor may be diode-connected.

The second PMOS transistor may operate in a saturation region when the first PMOS transistor is turned-on in response to the inverted version of the read column selection signal.

In example embodiments, the memory core may further include a precharge circuit coupled between the first node and the second node in parallel with the bit-line senses amplifier. The precharge circuit may precharge the bit-line and the complementary bit-line to a precharge voltage level during precharge interval, in response to a first precharge control signal and a second precharge control signal.

The precharge circuit may include a first PMOS transistor coupled between the first node and a third node connected to a precharge voltage, a second PMOS transistor coupled between the third node and the second node and a third PMOS transistor coupled between the first node and the second node in parallel with the first PMOS transistor and the second PMOS transistor.

The first precharge control signal may be applied to a gate of the first PMOS transistor and a gate of the third PMOS transistor and the second precharge control signal may be applied to a gate of the second PMOS transistor.

The second precharge control signal may transition to an active level simultaneously with the first precharge control signal. An activation interval of the second precharge control signal may be longer than an activation interval of the first precharge control signal.

In example embodiments, the bit-line sense amplifier may include a first PMOS transistor coupled between the first node and a third node, a second PMOS transistor coupled between the second node and the third node, a third PMOS transistor coupled between the third node and an internal power supply voltage, a first NMOS transistor coupled to the first node and a fourth node, a second NMOS transistor coupled to the second node and the fourth node and a third NMOS transistor coupled to the fourth node and a ground voltage. A gate of the first PMOS transistor and a gate of the first NMOS transistor may be commonly coupled to the second node and a gate of the second PMOS transistor and a gate of the second NMOS transistor may be commonly coupled to the first node.

The sensing control signal may be applied to a gate of the third NMOS transistor, and an inverted version of the sensing control signal may be applied to the third PMOS transistor. The first PMOS transistor and the second PMOS transistor may sense the voltage difference and amplify the voltage difference using the internal power supply voltage.

In example embodiments, the memory core may further include at least a second resistive type memory cell coupled to the complementary bit-line at the second node, and a second resistance to voltage converter coupled to the complementary bit-line at the second node. The second resistance to voltage converter may convert a resistance of the second resistive type memory cell to a corresponding voltage based on the read column selection signal.

According to example embodiments, a resistive type memory device a memory cell array includes a plurality of sub array blocks and a plurality of bit-line sense amplifier regions disposed adjacent to the plurality of sub array blocks such that the plurality of sub array blocks and plurality of bit-line sense amplifier regions are alternatingly arranged. At least one of the sub array blocks includes at least a first resistive type memory cell coupled to a bit-line and at least a second resistive type memory cell coupled to a complementary bit-line. One of the plurality of bit-line sense amplifier regions includes a first resistance to voltage converter coupled to the bit-line at a first node coupled to the first resistive type memory cell and a bit-line sense amplifier coupled to the bit-line at the first node and coupled to a complementary bit-line at a second node. The first resistance to voltage converter converts a resistance of the first resistive type memory cell to a corresponding voltage based on a read column selection signal. The bit-line sense amplifier may sense and amplify a voltage difference between the bit-line and the complementary bit-line in response to a sensing control signal.

In example embodiments, the first resistive type memory cell and the second resistive type memory cell may be respectively disposed in two different sub array blocks of the plurality of sub array blocks, the two different sub array blocks adjacent to and at opposite respective sides of the bit-line sense amplifier, of the plurality of sub array blocks.

In example embodiments, the first resistive type memory cell and the second resistive type memory cell may be disposed in one sub array block adjacent to the bit-line sense amplifier, of the plurality of sub array blocks.

In example embodiments, the resistive type memory device may be one of a magnetic random access memory (MRAM), a resistive random access memory (RRAM), a phase change random access memory (PRAM) and a ferroelectric random access memory (FRAM).

In example embodiments, each of the first resistive type memory cell and the second resistive type memory cell may be a spin transfer torque magneto-resistive random access memory (STT-MRAM) cell that includes a magnetic tunnel junction (MTJ) element and a cell transistor.

In example embodiments, one of the plurality of bit-line sense amplifier regions may further include a second resistance to voltage converter coupled to the complementary bit-line at the second node. The second resistance to voltage converter may convert a resistance of the second resistive type memory cell to a corresponding voltage based on the read column selection signal.

In example embodiments, the first resistive type memory cell may include a magnetic tunnel junction (MTJ) element and a cell transistor. The MTJ element may have first terminal coupled to the bit-line. The cell transistor may have a first electrode coupled to a second terminal of the MJT element, a gate terminal coupled to a word-line and a second electrode coupled to a source line.

In example embodiments, the resistive type memory device may further include a precharge circuit coupled between the first node and the second node in parallel with the bit-line sense amplifier. The precharge circuit may precharge the bit-line and the complementary bit-line to a precharge voltage level during precharge interval, in response to a first precharge control signal and a second precharge control signal.

According to example embodiments, a method of sensing data in a resistive type memory device may include precharging a bit-line and a complementary bit-line, wherein the bit-line is coupled to at least a first resistive type memory cell and the complementary bit-line is coupled to at least a second resistive type memory cell, enabling a selected word-line coupled to the first resistive type memory cell, activating a read column selection signal to convert a resistance to a corresponding voltage of the first resistive type memory cell and sensing and amplifying the converted voltage using a bit-line sense amplifier to determine data stored in the first resistive type memory cell.

In example embodiments, each of the first resistive type memory cell and the second resistive type memory cell may be a spin transfer torque magneto-resistive random access memory (STT-MRAM) cell that includes a magnetic tunnel junction (MTJ) element and a cell transistor.

Accordingly, a resistive type memory device may include resistance to voltage converts that convert resistance corresponding data stored in the resistive type memory cell to a corresponding voltage and a bit-line sense amplifier that has a cross-coupled latch, and thus may enhance performance by obtaining enough sensing margin without regard to variance of process and signals without generating extra reference current or reference voltage and may increase integration rate due to simple configuration of the bit-line sense amplifier. In addition, since the precharge circuit maintains the complementary bit-line to the precharge voltage level longer than the bit-line, the voltage of the complementary bit-line may serve as a reference voltage stably in the sensing operation.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
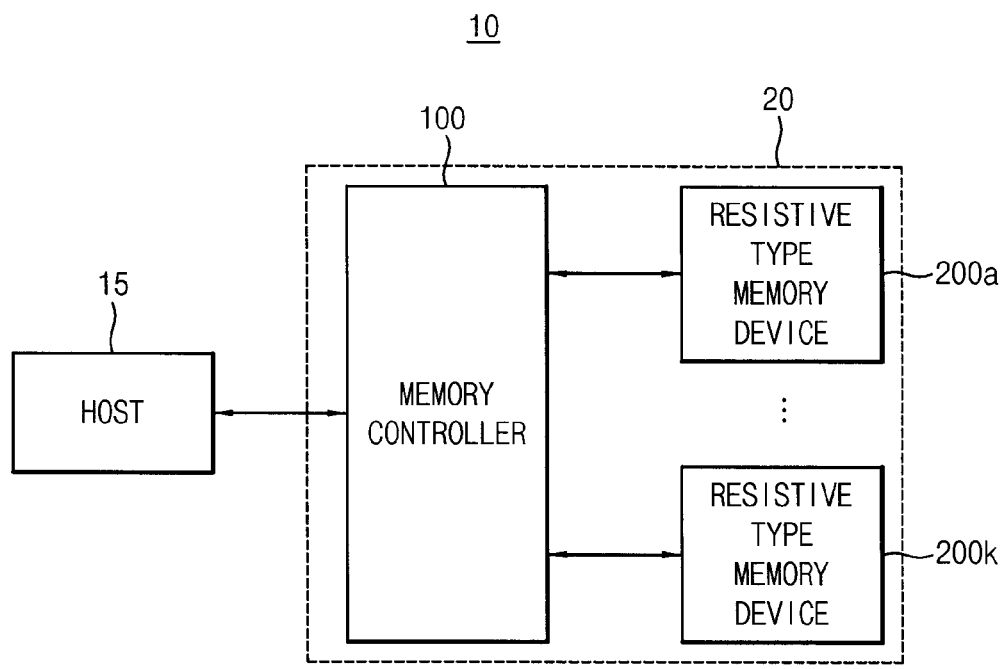
FIG. 1 is a block diagram illustrating an electronic system according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. These example embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless the context indicates otherwise, these terms are only used to distinguish one element from another, for example as a naming convention. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 may include a host 15 and a memory system 20. The memory system 20 may include a memory controller 100 and a plurality of resistive type memory devices 200a~200k.

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of resistive type memory devices 200a~200k. For example, the memory controller 100 may write data in the plurality of resistive type memory devices 200a~200k or read data from the plurality of resistive type memory devices 200a~200k in response to request from the host 15.

In addition, the memory controller 100 may issue operation commands to the plurality of resistive type memory devices 200a~200k for controlling the plurality of resistive type memory devices 200a~200k.

In some embodiments, each of the plurality of resistive type memory devices 200a~200k may be a memory device including resistive type memory cells such as a magnetic random access memory (MRAM), a resistive random access memory (RRAM), a phase change random access memory (PRAM) and a ferroelectric random access memory (FRAM), etc.

An MRAM is a nonvolatile computer memory based on magnetoresistance. An MRAM is different from a volatile RAM in many aspects. Since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance elements. In general, a magnetoresistance element is made of two magnetic layers each having magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (pinned layer) may be fixed and a magnetization direction of the other magnetic layer (free layer) may vary according to a magnetic field generated by a program current.

The magnetic field of the program current may arrange the magnetization directions of the two magnetic layers in parallel or anti-parallel. In one embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance. The program current applied to switch the high and low states of the resistance between the magnetic layers of the MRAM is typically high. Accordingly, when a plurality of cells are arranged in an MRAM array, a program current applied to one memory cell may change a magnetic field of a free layer of an adjacent cell. Such a write disturbance may be prevented by using an STT phenomenon. A typical STT-MRAM may include a magnetic tunnel junction (MTJ), which is a magnetoresistive data storage device including two magnetic layers (a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced, and prevents the write disturbance. In addition, the STT-MRAM may have a high tunnel magnetoresistance ratio, and improves a read operation in a magnetic domain by allowing a high ratio between the high and low states.

An MRAM is an all-round memory device that is low cost and has high capacity (like a dynamic random access memory (DRAM)), operates at high speed (like a static random access memory (SRAM)), and is nonvolatile (like a flash memory).

Figure 2:
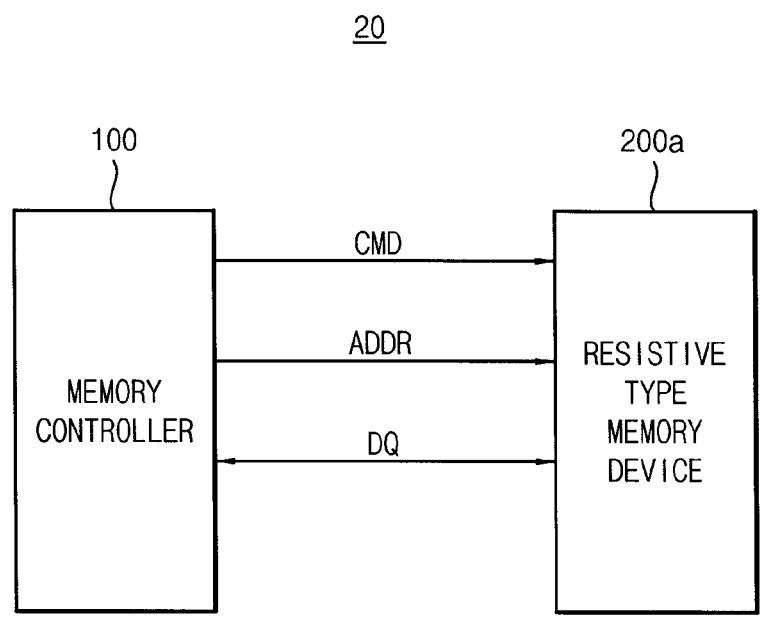
FIG. 2 is a block diagram illustrating an example of the memory system in FIG. 1 according to example embodiments.

FIG. 2 is a block diagram illustrating an example of the memory system in FIG. 1 according to example embodiments.

In FIG. 2, only one resistive type memory device 200a in communication with the memory controller 100 is illustrated for convenience. However, the details discussed herein related to resistive type memory device 200a may equally apply to the other resistive type memory devices 200b-200k.

Referring to FIG. 2, the memory system 20 may include the memory controller 100 and the resistive type memory device 200a. The memory controller 100 may transmit command CMD and address ADDR to the resistive type memory device 200a. The memory controller 100 may exchange data DQ with the resistive type memory device 200a.

Referring to FIGS. 1 and 2, the memory controller 100 may input data to the resistive type memory device 200a or may output data from the resistive type memory device 200a based on the request from the host 15.

Figure 3:
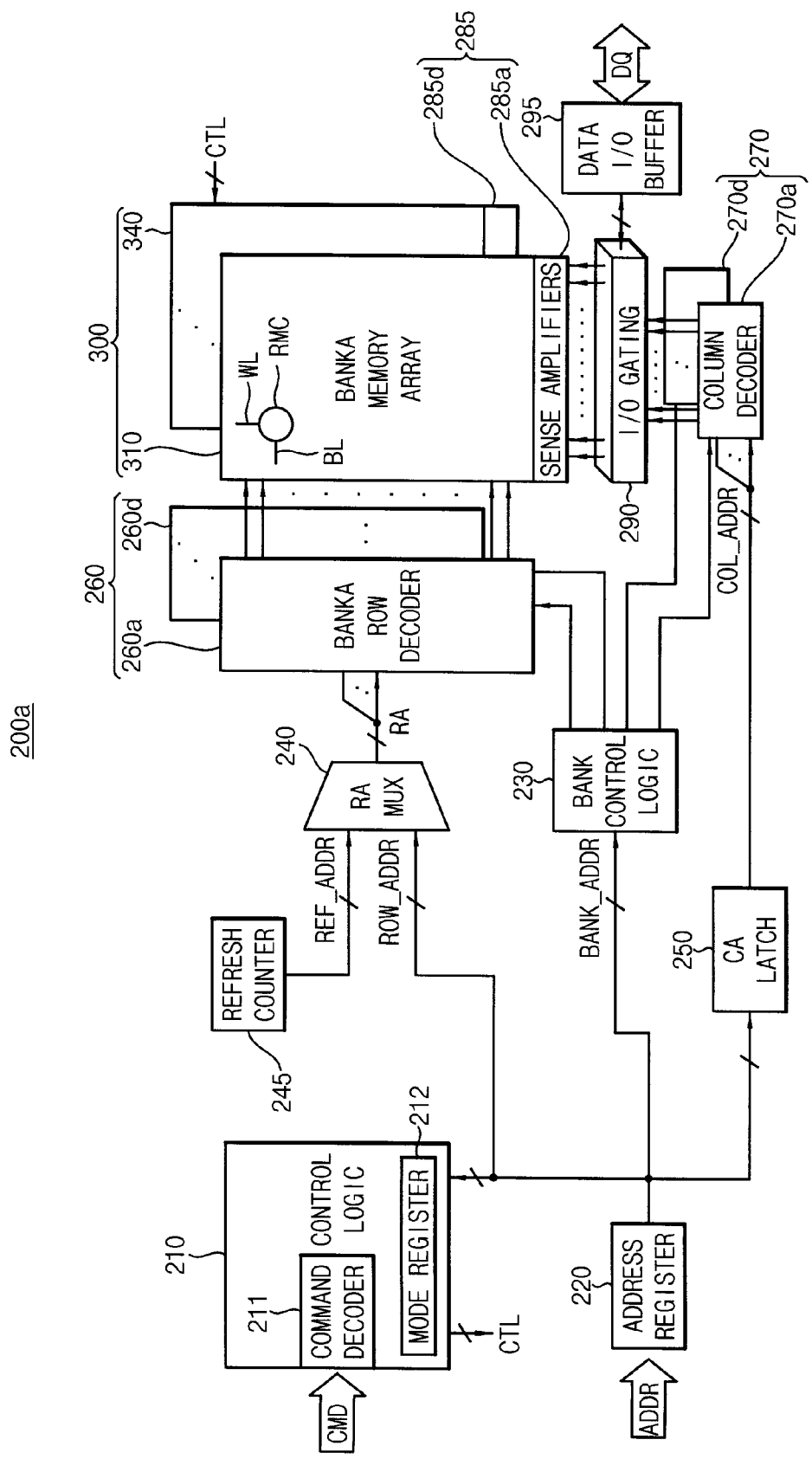
FIG. 3 is a block diagram illustrating an example of the resistive type memory device in FIG. 2 according to example embodiments.

FIG. 3 is a block diagram illustrating an example of the resistive type memory device in FIG. 2 according to example embodiments.

Referring to FIG. 3, the resistive type memory device 200a may include a control logic 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, and a refresh counter 245.

The memory cell array 300 may include first through eighth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~285d respectively coupled to the first through fourth bank arrays 310~340. The first through fourth bank arrays 310~340, the first through fourth bank row decoders 260a~260d, the first through fourth bank column decoders 270a~270d and first through fourth bank sense amplifiers 285a~285d may form first through fourth banks Each of the first through fourth bank arrays 310~340 may include a plurality of resistive type memory cells RMC, and each of resistive type memory cells RMC is coupled to a corresponding word-line and a corresponding bit-line. Although the resistive type memory device 200a is illustrated in FIG. 3 as including four banks, the resistive type memory device 200a may include any number of banks. In some embodiments, the different banks, as well as row and column decoders, may be formed on a single semiconductor chip (e.g., a die formed from a wafer). In other embodiments, each group of a different bank, row decoder, and column decoder (or different sets of groups) may be formed on a plurality of different respective semiconductor chips, such as a stack of semiconductor chips.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the input/output gating circuit 290 in order to output data corresponding to the column address COL_ADDR.

The I/O gating circuit 290 may include circuitry for gating input/output data. The I/O gating circuit 290 may further include read data latches for storing data that is output from the first through fourth bank arrays 310~340, and write drivers for writing data to the first through fourth bank arrays 310~340.

Data to be read from one bank array of the first through fourth bank arrays 310~340 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through fourth bank arrays 310~340 may be provided to the data I/O buffer 295 from the memory controller 100. The write driver may write the data DQ in one bank array of the first through fourth bank arrays 310~340.

The control logic 210 may control operations of the resistive type memory device 200a. For example, the control logic 210 may generate control signals CTL for the resistive type memory device 200a in order to perform a write operation or a read operation. The control logic 210 may include, for example, a command decoder 211 that decodes a command CMD received from the memory controller 100 and a mode register 212 that sets an operation mode of the resistive type memory device 200a. The mode register 212 may be programmed by mode register set (MRS) commands. The mode register 212 may generate mode signals according to a programmed operation mode.

For example, the command decoder 211 may generate the control signals CTL corresponding to the command CMD by decoding a write enable signal (/WE), a row address strobe signal (/RAS), a column address strobe signal (/CAS), a chip select signal (/CS), etc. The control logic 210 may provide the control signals CTL to the memory cell array 300 and the control signal CTL may include a read column selection signal RCSL, sensing control signals SAE and SAEB, a first precharge control signal PREC1 and a second precharge control signal PREC2 which will be described later in FIG. 12.

FIGS. 4A to 4D are circuit diagrams of examples of the resistive type memory cell in FIG. 3 according to example embodiments.

Figure 4A:
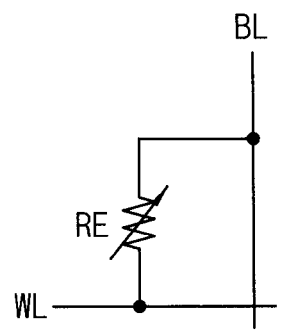
FIGS. 4A to 4D are circuit diagrams of examples of the resistive type memory cell in FIG. 3 according to example embodiments.
Figure 4B:
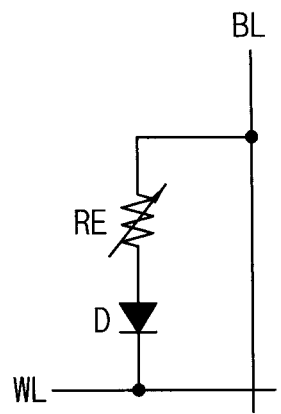
Figure 4C:
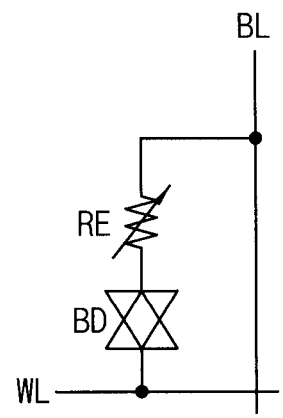
Figure 4D:
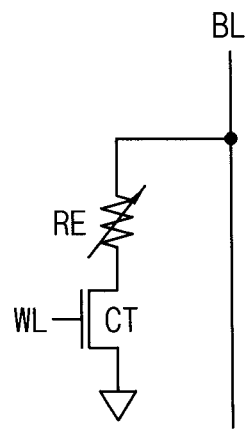

FIG. 4A shows a resistive type memory cell without a selection element, while FIGS. 4B to 4D show resistive type memory cells each comprising a selection element.

Referring to FIG. 4A, a resistive type memory cell RMC may include a resistive element RE connected to a bit-line BL and a word-line WL. Such a resistive type memory cell having a structure without a selection element may store data by a voltage applied between bit-line BL and word-line WL.

Referring to FIG. 4B, a resistive type memory cell RMC may include a resistive element RE and a diode D. Resistive element RE may include a resistive material for data storage. Diode D may include a selection element (or switching element) that supplies current to resistive element R or cuts off the current supply to resistive element R according to a bias of word-line WL and bit-line BL. Diode D may be coupled between resistive element RE and word-line WL, and resistive element RE may be coupled between bit-line BL and diode D. Positions of diode D and resistive element RE may be interchangeable. Diode D may be turned on or turned off by a word-line voltage. Thus, a resistive memory cell may be not be driven where a voltage of a constant level or higher is supplied to an unselected word-line WL.

Referring to FIG. 4C, a resistive type memory cell RMC may include a resistive element RE and a bidirectional diode BD. Resistive element RE may include a resistive material for data storage. Bidirectional diode BD may be coupled between resistive element RE and a word-line WL, and resistive element RE may be coupled between a bit-line BL and bidirectional diode BD. Positions of bidirectional diode BD and resistive element RE may be interchangeable. Bidirectional diode BD may block leakage current flowing to an unselected resistive type memory cell.

Referring to FIG. 4D, a resistive type memory cell RMC may include a resistive element RE and a transistor CT. Transistor CT may be a selection element (or switching element) that supplies current to resistive element RE or cuts off the current supply to resistive element RE according to a voltage of a word-line WL. Transistor CT may be coupled between resistive element RE and a word-line, and resistive element RE may be coupled between a bit-line BL and transistor CT. Positions of transistor CT and resistive element RE may be interchangeable. The resistive type memory cell may be selected or unselected depending on whether transistor CT driven by word-line WL is turned on or turned off.

Figure 5:
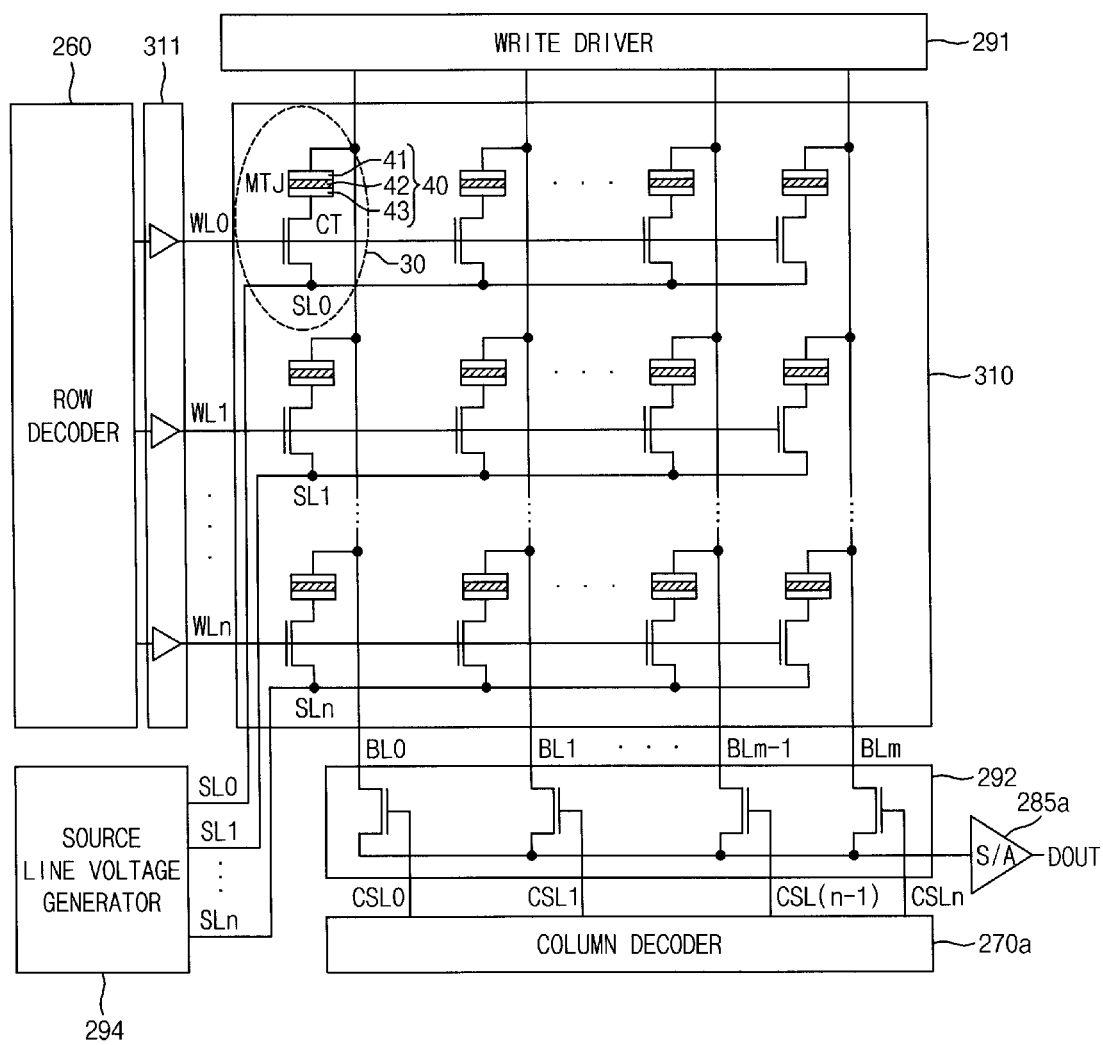
FIG. 5 illustrates an example of the first bank array in the resistive type memory device of FIG. 3 according to example embodiments.

FIG. 5 illustrates an example of the first bank array in the resistive type memory device of FIG. 3 according to example embodiments.

Referring to FIG. 5, the first bank array 310 may include a plurality of word-lines WL0 through WLn (where n is a natural number equal to or greater than 1), a plurality of bit-lines BL0 through BLm (where M is a natural number equal to or greater than 1), a plurality of source lines SL0 through SLn, and a plurality of resistive type memory cells 30 disposed at intersections between the word-lines WL0 through WLn and the bit-lines BL0 through BLm. Each of the resistive type memory cells 30 may be an STT-MRAM cell. The resistive type memory cell 30 may include an MTJ element 40 having a magnetic material.

Each of the resistive memory cells 30 may include a cell transistor CT and the MTJ element 40. In one memory cell 30, a drain (a first electrode) of the cell transistor CT may be connected to a pinned layer 43 of the MTJ element 40. A free layer 41 of the MTJ 40 may be connected to the bit-line BL0, and a source (a second electrode) of the cell transistor CT may be connected to the source line SL0. A gate of the cell transistor CT may be connected to the word line WL0.

The MTJ element 40 may be replaced by a resistive device such as a phase change random access memory (PRAM) using a phase change material, a resistive random access memory (RRAM) using a variable resistive material such as a complex metal oxide, or a magnetic random access memory (MRAM) using a ferromagnetic material. Materials forming the resistive devices have resistance values that vary according to a size and/or a direction of a current or a voltage, and are nonvolatile and thus may maintain the resistance values even when the current or the voltage is cut off.

The word-line WL0 may be enabled by a row decoder 260, and may be connected to a word line driver 311 that drives a word-line selection voltage. The word-line selection voltage activates the word-line WL0 in order to read or write a logic state of the MTJ element 40.

The source line SL0 is connected to a source line voltage generator 294. The source line voltage generator 294 may receive and decode an address signal and a read/write signal, and may generate a source line selection signal in the selected source line SL0. A ground reference voltage may be supplied to the unselected source lines SL1 through SLn.

The bit-line BL0 is connected to a column select circuit 292 that is driven by column selection signals CSL0 through CSLm. The column selection signals CSL0 through CSLm are selected by a column decoder 270a. For example, the selected column selection signal CSL0 turns on a column select transistor in the column selection circuit 292, and selects the bit-line BL0. A logic state of the MTJ element 40 is read from the bit-line BL0 through a sense amplifier 285a. Alternatively, a write current applied through the write driver 291 is transmitted to the selected bit-line BL0 and is written to the MTJ element 40.

Figure 6:
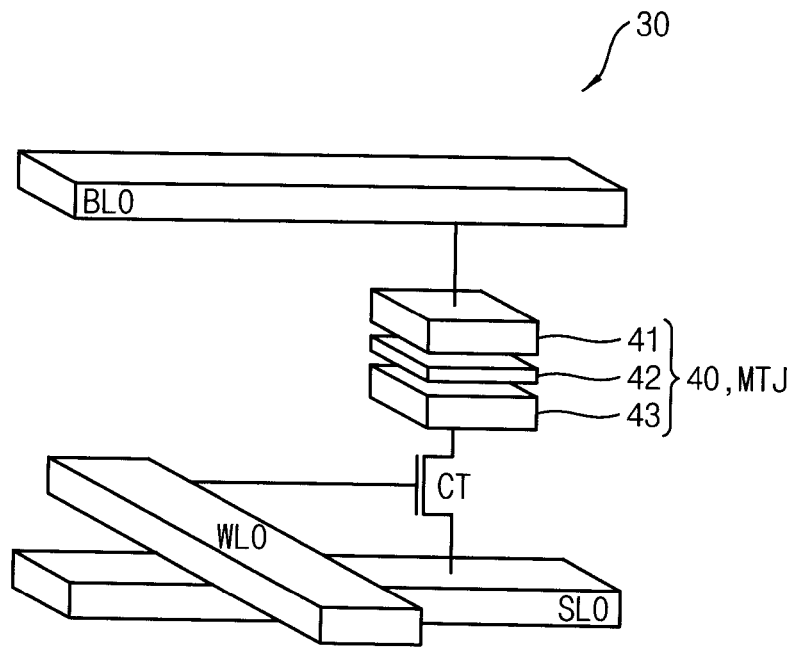
FIG. 6 is a stereogram illustrating the resistive type memory cell (referred to as STT-MRAM cell) in FIG. 5 according to example embodiments.

FIG. 6 is a stereogram illustrating the resistive type memory cell (referred to as STT-MRAM cell) in FIG. 5 according to example embodiments.

Referring to FIG. 6, the STT-MRAM cell 30 may include the MTJ element 40 and the cell transistor CT. A gate of the cell transistor CT is connected to a word-line (for example, the word-line WL0), and one electrode of the cell transistor CT is connected through the MTJ 40 to a bit-line (for example, the bit-line BL0). Also, the other electrode of the cell transistor CT is connected to a source line (for example, the source line SL0).

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL0 to turn on the cell transistor CT. A program current, that is, a write current is applied to the bit-line BL0 and the source line SL0. A direction of the write current is determined by a logic state of the MTJ element 40.

In order to perform a read operation of the STT-MRAM cell 30, a logic high voltage is applied to the word-line WL0 to turn on the cell transistor CT, and a read current is supplied to the bit-line BL0 and the source line SL0. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 7A:
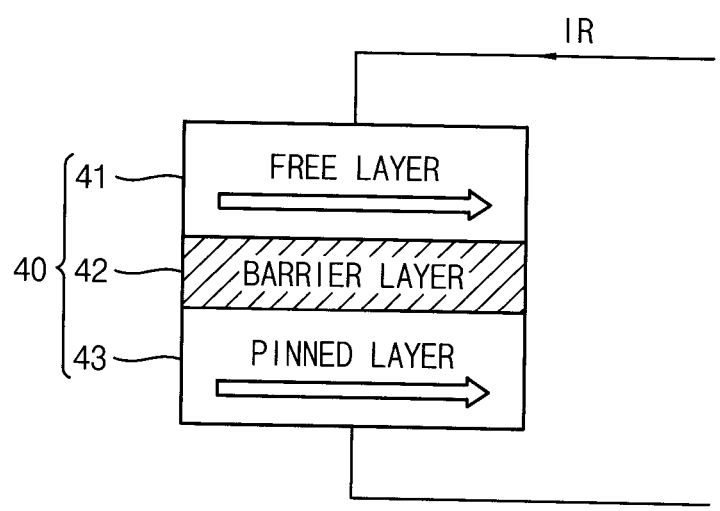
FIGS. 7A and 7B are block diagrams for explaining a magnetization direction according to data written to the MTJ element of FIG. 6.
Figure 7B:
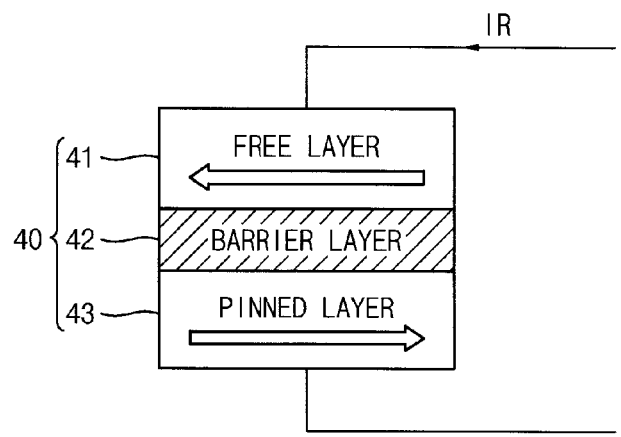

FIGS. 7A and 7B are block diagrams for explaining a magnetization direction according to data written to the MTJ element of FIG. 6.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 7A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

Referring to FIG. 7B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ 40 are horizontal magnetic layers, the present disclosure is not limited thereto and the free layer 41 and the pinned layer 43 may be, for example, vertical magnetic layers.

Figure 8:
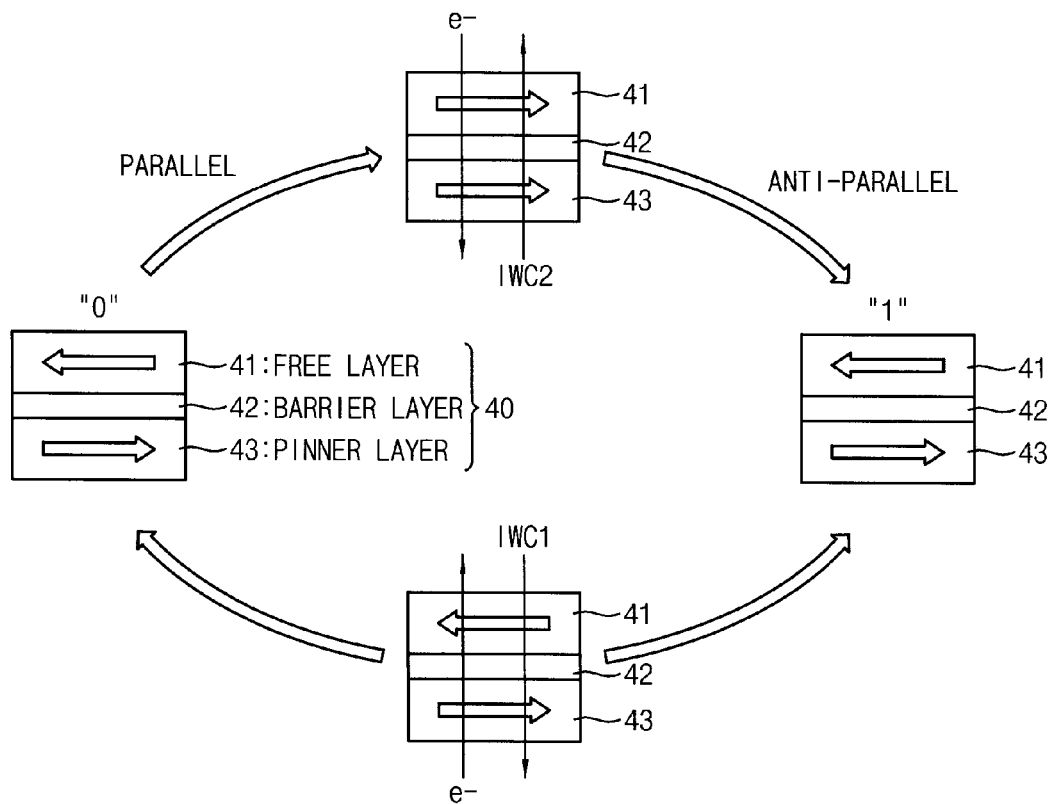
FIG. 8 is a block diagram for explaining a write operation of the STT-MRAM cell of FIG. 6 according to example embodiments.

FIG. 8 is a block diagram for explaining a write operation of the STT-MRAM cell of FIG. 6 according to example embodiments.

Referring to FIG. 8, a magnetization direction of the free layer 41 may be determined based on a direction of a write current IW flowing through the MTJ 40. For example, when a first write current IWC1 is supplied from the free layer 41 to the pinned layer 43, free electrons having the same spin direction as that of the pinned layer 43 apply a torque to the free layer 41. Accordingly, the free layer 41 may be magnetized parallel to the pinned layer 43.

When a second write current IWC2 is applied from the pinned layer 43 to the free layer 41, electrons having a spin direction opposite to that of the pinned layer 41 return to the free layer 43 and apply a torque. Accordingly, the free layer 41 may be magnetized anti-parallel to the pinned layer 43. That is, a magnetization direction of the free layer 41 of the MTJ 40 may be changed by an STT.

Figure 9A:
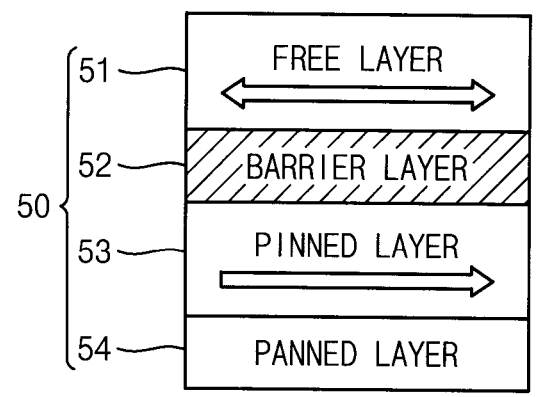
FIGS. 9A and 9B are block diagrams illustrating MTJs in the STT-MRAM cell in FIG. 6 according to example embodiments.
Figure 9B:
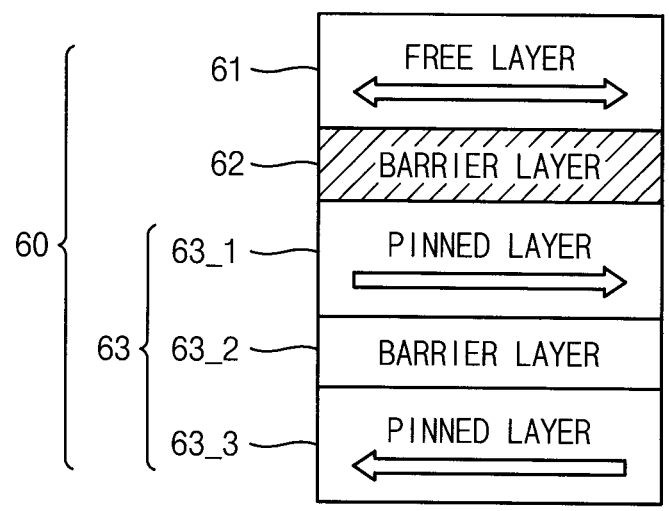

FIGS. 9A and 9B are block diagrams illustrating MTJs in the STT-MRAM cell in FIG. 6 according to example embodiments.

Referring to FIG. 9A, the MTJ 50 may include a free layer 51, a tunnel layer 52, a pinned layer 53, and an anti-ferromagnetic layer 54. The free layer 51 may include a material having a variable magnetization direction. A magnetization direction of the free layer 51 may vary according to electrical/magnetic factors provided outside and/or inside of a memory cell. The free layer 51 may include a ferromagnetic material including, for example, at least one of cobalt (Co), iron (Fe), and nickel (Ni). For example, the free layer 51 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe Fe_2O_3$, $MgOFe Fe_2O_3$, EuO, and $Y_3Fe_5O_{12}$.

The tunnel layer 52, also referred to as a barrier layer 52, may have a thickness less than a spin diffusion distance. The tunnel layer 52 may include a non-magnetic material. For example, the tunnel layer 52 may include at least one selected from the group consisting of magnesium (Mg), titanium (Ti), aluminum (Al), a magnesium-zinc (MgZn) oxide, a magnesium-boron (MgB) oxide, a Ti nitride, and a vanadium (V) nitride.

The pinned layer 53 may have a magnetization direction fixed by the anti-ferromagnetic layer 54. Also, the pinned layer 53 may include a ferromagnetic material. For example, the pinned layer 53 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe Fe_2O_3$, $MgOFe Fe_2O_3$, EuO, and $Y_3Fe_5O_{12}$.

The anti-ferromagnetic layer 54 may include an anti-ferromagnetic material. For example, the anti-ferromagnetic layer 54 may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

Since each of the free layer 51 and the pinned layer 53 of the MTJ element 50 may be formed of a ferromagnetic material, a stray field may be generated at an edge of the ferromagnetic material. The stray field may reduce magnetoresistance or increase resistive magnetism of the free layer 51. In addition, the stray field may affect switching characteristics, thereby resulting in asymmetric switching. Accordingly, a structure for reducing or controlling a stray field generated at the ferromagnetic material in the MTJ element 50 may be used.

Referring to FIG. 9B, a pinned layer 63 of the MTJ element 60 may be formed of a synthetic anti-ferromagnetic (SAF) material. The pinned layer 63 may include a first ferromagnetic layer 63_1, a coupling layer 63_2, and a second ferromagnetic layer 63_3. Each of the first and second ferromagnetic layers 63_1 and 63_3 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe Fe_2O_3$, $MgOFe Fe_2O_3$, EuO, and $Y_3Fe_5O_{12}$. In this case, a magnetization direction of the first ferromagnetic layer 63_1 and a magnetization direction of the second ferromagnetic layer 63_3 are different from each other, and are fixed. The coupling layer 63_2 may include ruthenium (Ru), for example.

Figure 10:
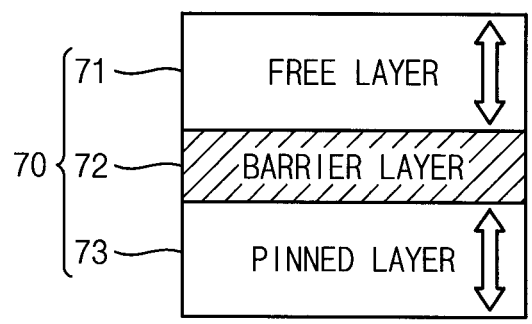
FIG. 10 is a block diagram illustrating an MTJ element in the STT-MRAM cell in FIG. 6 according to example embodiments.

FIG. 10 is a block diagram illustrating an MTJ element in the STT-MRAM cell in FIG. 6 according to example embodiments.

Referring to FIG. 10, a magnetization direction of the MTJ element 70 is vertical and a moving direction of a current and a magnetization easy-axis are substantially parallel to each other. The MTJ element 70 includes a free layer 71, a tunnel layer 72, and a pinned layer 73. A resistance value is small when a magnetization direction of the free layer 71 and a magnetization direction of the pinned layer 73 are parallel to each other, and, is large when a magnetization direction of the free layer 71 and a magnetization direction of the pinned layer 73 are anti-parallel to each other. Data may be stored in the MTJ element 70 according to the resistance value.

In order to realize the MTJ element 70 having a vertical magnetization direction, each of the free layer 71 and the pinned layer 73 may be formed of a material having high magnetic anisotropy energy. Examples of the material having high magnetic anisotropy energy include an amorphous rare earth element alloy, a multi-layer thin film such as (Co/Pt)n or (Fe/Pt)n, and an ordered lattice material having an L10 crystal structure. For example, the free layer 71 may be formed of an ordered alloy, and may include at least one selected from the group consisting of Fe, Co, Ni, palladium (Pa), and platinum (Pt). Alternatively, the free layer 71 may include at least one selected from the group consisting of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. Such alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

The pinned layer 73 may be formed of an ordered alloy, and may include at least one selected from the group consisting of Fe, Co, Ni, Pa, and Pt. For example, the pinned layer 73 may include at least one selected from the group consisting of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. Such alloys may be, for example, $Fe_{50}Pt_{50}$, $Fe_{50}Pd_{50}$, $Co_{50}Pd_{50}$, $CO_{50}N_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

Figure 11A:
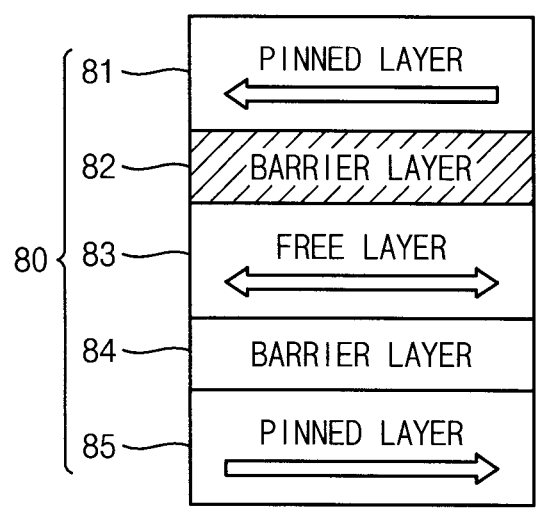
FIGS. 11A and 11B are block diagrams illustrating dual MTJs in the STT-MRAM cell in FIG. 6 according to example embodiments.
Figure 11B:
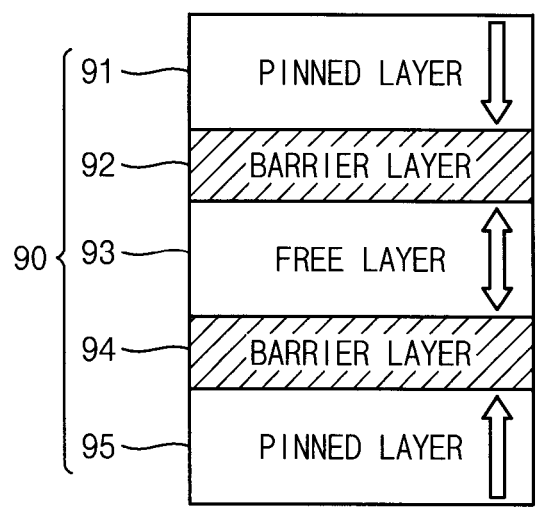

FIGS. 11A and 11B are block diagrams illustrating dual MTJs in the STT-MRAM cell in FIG. 6 according to example embodiments. A dual MTJ is configured such that a tunnel layer and a pinned layer are disposed at both ends of a free layer.

Referring to FIG. 11A, the dual MTJ element 80 having a horizontal magnetization direction may include a first pinned layer 81, a first tunnel layer 82, a free layer 83, a second tunnel layer 84, and a second pinned layer 85. Materials of the first and second pinned layers 81 and 85 are similar to that of the pinned material 53 of FIG. 9A, materials of the first and second tunnel layers 82 and 84 are similar to that of the tunnel layer 52 of FIG. 9A, and a material of the free layer 83 is similar to that of the free layer 51 of FIG. 7A.

When a magnetization direction of the first pinned layer 81 and a magnetization direction of the second pinned layer 85 are fixed to opposite directions, magnetic forces by the first and second pinned layers 81 and 85 substantially counterbalance. Accordingly, the dual MTJ element 80 may perform a write operation by using a smaller current than a general MTJ element.

Since the dual MTJ element 80 provides a higher resistance during a read operation due to the second tunnel layer 84, an accurate data value may be obtained.

Referring to FIG. 11B, the dual MTJ element 90 having a vertical magnetization direction includes a first pinned layer 91, a first tunnel layer 92, a free layer 93, a second tunnel layer 94, and a second pinned layer 95. Materials of the first and second pinned layers 91 and 95 are similar to that of the pinned layer 73 of FIG. 10, materials of the first and second tunnel layers 92 and 94 are similar to that of the tunnel layer 72 of FIG. 10, and a material of the free layer 93 is similar to that of the free layer 71 of FIG. 10.

In this case, when a magnetization direction of the first pinned layer 91 and a magnetization direction of the second pinned layer 95 are fixed to opposite directions, magnetic forces by the first and second pinned layers 91 and 95 substantially counterbalance. Accordingly, the dual MTJ element 90 may perform a write operation by using a smaller current than a general MTJ element.

Figure 12:
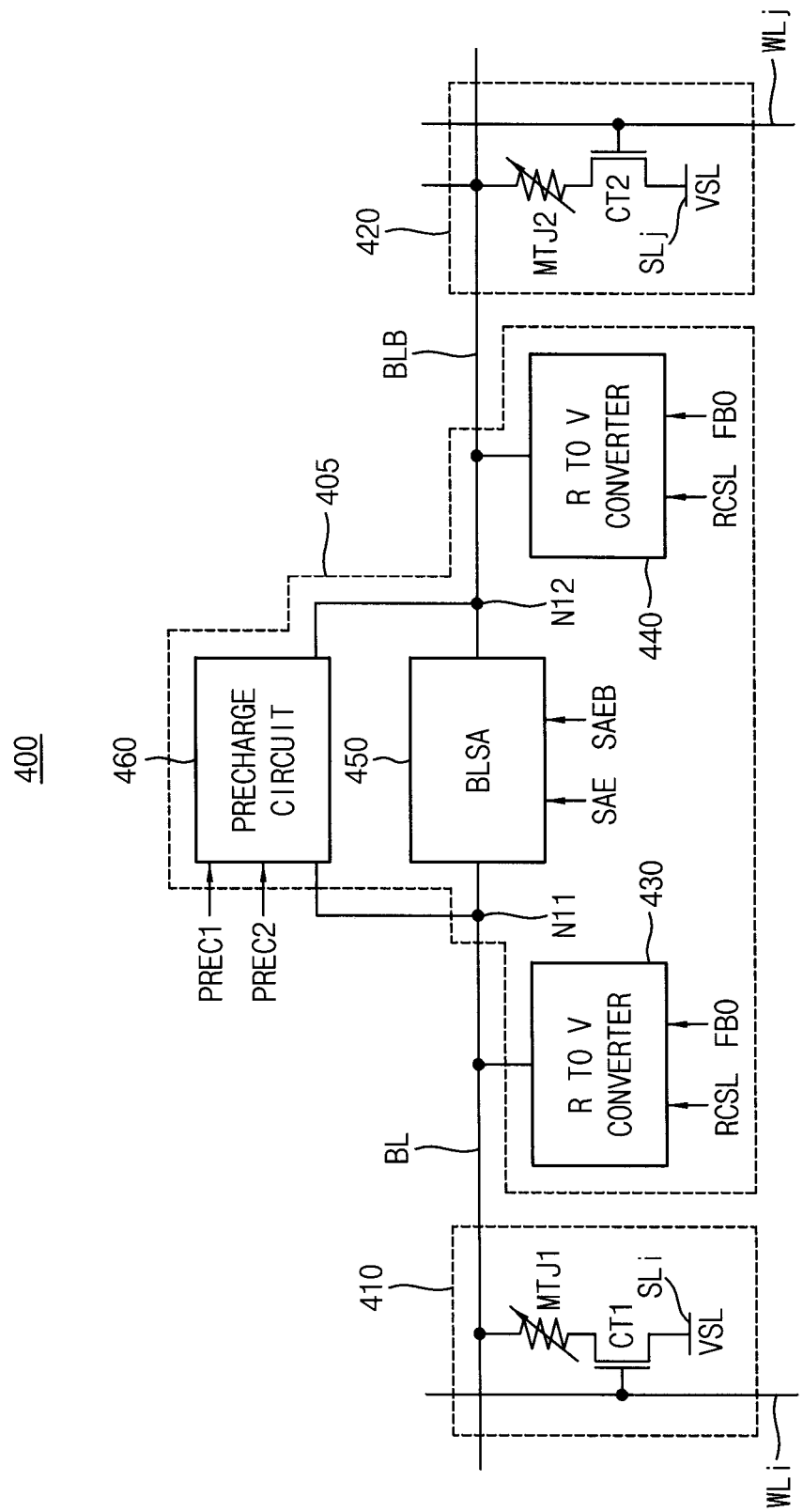
FIG. 12 is a block diagram illustrating a memory core that may be included in each bank array in the resistive type memory device of FIG. 3 according to example embodiments.

FIG. 12 is a block diagram illustrating a memory core that may be included in each bank array in the resistive type memory device of FIG. 3 according to example embodiments.

Referring to FIG. 12, a memory core 400 (a memory core may include circuitry at least including at least first and second resistive type memory cells, at least first and second resistance to voltage converters, at least one bit-line sense amplifier and at least one precharge circuit) of a resistive type memory device may include at least a first resistive type memory cell 410, at least a second resistive type memory cell 420, a first resistance to voltage converter 430, a second resistance to voltage converter 440, a bit line sense amplifier 450, and a precharge circuit 460. The first resistance to voltage converter 430, the second resistance to voltage converter 440, bit line sense amplifier 450, and the precharge circuit 460 may constitute a sense amplification circuit 405. Although only one unit including a set of elements (410, 420, 430, 440, 450, and 460) is shown in FIG. 12, the memory core 400 according to certain embodiments for FIG. 12 as well as the other figures describing a memory core includes a plurality of these units to form a bank array of FIG. 3.

The first resistive type memory cell 410 may be coupled between a word-line WLi and a bit-line BL. The first resistive type memory cell 410 may include a MTJ element MTJ1 and a cell transistor CT1 coupled in series between the bit-line BL and a source line SLi. The cell transistor CT1 has a first electrode coupled to the MTJ element MTJ1, a second electrode coupled to the source line SLi and a gate electrode coupled to the word-line WLi. The source line SLi may receive a source line voltage VSL.

The second resistive type memory cell 420 may be coupled between a word-line WLj and a complementary bit-line BLB. The second resistive type memory cell 420 may include a MTJ element MTJ2 and a cell transistor CT2 coupled in series between the complementary bit-line BLB and a source line SLj. The cell transistor CT2 has a first electrode coupled to the MTJ element MTJ2, a second electrode coupled to the source line SLj and a gate electrode coupled to the word-line WLj. The source line SLj may receive a source line voltage VSL.

Each of the first resistive type memory cell 410 and the second resistive type memory cell 420 may have a STT-MRAM cell architecture described according, for instance, to one of the examples given with reference to FIGS. 6 through 11B.

The first resistance to voltage converter 430 may be coupled to the bit-line BL at a first node N11. The first resistance to voltage converter 430 may convert a resistance of the first resistive type memory cell 410 to a corresponding voltage based on a read column selection signal RCSL which is applied from the column decoder 270a in a read operation. The second resistance to voltage converter 440 may be coupled to the complementary bit-line BLB at a second node N12. The second resistance to voltage converter 440 may convert a resistance of the second resistive type memory cell 420 to a corresponding voltage based on the read column selection signal RCSL.

The bit-line sense amplifier 450 may be coupled between the bit-line BL and the complementary bit-line BLB. The bit-line sense amplifier 460 may sense and amplify a voltage difference of the bit-line BL and the complementary bit-line BLB in response to the sensing control signals SAE and SAEB.

The precharge circuit 460 may be coupled between the bit-line BL and the complementary bit-line BLB in parallel with the bit-line sense amplifier 450. The precharge circuit 460 may precharge the bit-line BL and the complementary bit-line BLB to a precharge voltage level during a precharge interval in response to a first precharge control signal PREC1 and a second precharge control signal PREC2.

Figure 13:
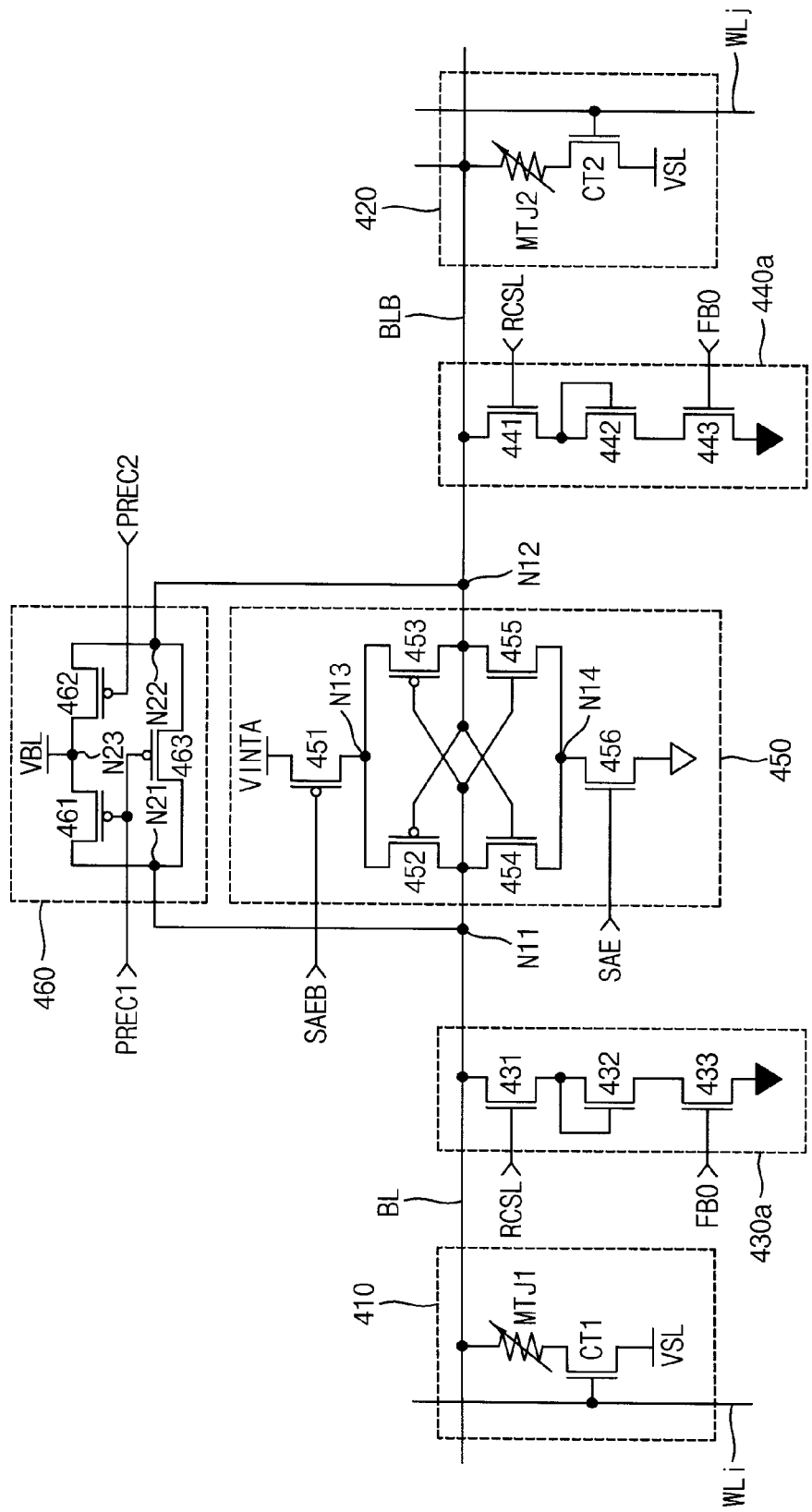
FIG. 13 is a circuit diagram illustrating an example of the memory core of FIG. 12 according to example embodiments.

FIG. 13 is a circuit diagram illustrating an example of the memory core of FIG. 12 according to example embodiments.

Referring to FIGS. 12 and 13, a memory core 400a of a resistive type memory device may include at least a first resistive type memory cell 410, at least a second resistive type memory cell 420, a first resistance to voltage converter 430a, a second resistance to voltage converter 440a, a bit-line sense amplifier 450, and a precharge circuit 460.

The first resistance to voltage converter 430a may include n-channel metal oxide semiconductor (NMOS) transistors 431, 432 and 433 which are connected in series between the bit-line BL and a ground voltage. The NMOS transistor 431 may be coupled to the bit-line BL, the NMOS transistor 433 may be coupled to the ground voltage (e.g., via a ground line) and the NMOS transistor 432 may be coupled between the NMOS transistor 431 and the NMOS transistor 433. The NMOS transistor 431 may have a gate receiving the read column selection signal RCSL. The NMOS transistor 433 may have a gate receiving a bias voltage FBO that has a level to turn-on the NMOS transistor 433. The NMOS transistor 432 may have a gate coupled to a drain of the NMOS transistor 432. The NMOS transistor 432 may be diode-connected.

Therefore, the NMOS transistor 432 may operate in a saturation region not in a linear region when the NMOS transistor 431 is turned-on.

The second resistance to voltage converter 440a may include NMOS transistors 441, 442 and 443 which are connected in series between the complementary bit-line BLB and the ground voltage. The NMOS transistor 441 may be coupled to the complementary bit-line BLB, the NMOS transistor 443 may be coupled to the ground voltage (e.g., via a ground line), and the NMOS transistor 442 may be coupled between the NMOS transistor 441 and the NMOS transistor 443. The NMOS transistor 441 may have a gate receiving the read column selection signal RCSL. The NMOS transistor 443 may have a gate receiving a bias voltage FBO that has a level to turn-on the NMOS transistor 443. The NMOS transistor 442 may have a gate coupled to a drain of the NMOS transistor 442. The NMOS transistor 442 may be diode-connected. Therefore, the NMOS transistor 442 may operate in a saturation region not in a linear region when the NMOS transistor 441 is turned-on.

The bit-line sense amplifier 450 may include p-channel metal oxide semiconductor (PMOS) transistors 451, 452 and 453 and NMOS transistors 454, 455 and 456.

The PMOS transistor 451 may be coupled between an internal power supply voltage VINTA (e.g., from an internal power supply line) and a node N13 and the PMOS transistor 451 may has a gate receiving an inverted sensing control signal SAEB, which is an inverted version of the sensing control signal SAE. The PMOS transistor 452 may be coupled between the node N13 and the node N11 and the PMOS transistor 453 may be coupled between the node N13 and the node N12. The NMOS transistor 454 may be coupled between the node N11 and a node N14 and the NMOS transistor 455 may be coupled between the node N12 and the node N14. The NMOS transistor 456 may be coupled between the node N14 and the ground voltage and the NMOS transistor 456 may have a gate receiving the sensing control signal SAE. Gates of the PMOS transistor 452 and the NMOS transistor 454 may be commonly coupled to the complementary bit-line BLB at the node N12 and gates of the PMOS transistor 453 and the NMOS transistor 455 may be commonly coupled to the bit-line BL at the node N11. Therefore, the PMOS transistors 452 and 453 and the NMOS transistors 454 and 455 may constitute a cross-coupled latch.

The PMOS transistors 452 and 453 may sense the voltage difference of the bit-line BL and the complementary bit-line BLB and may amplify the voltage difference using the internal power supply voltage VINTA when the inverted sensing control signal SAEB is enabled at a logic low level. The NMOS transistors 454 and 455 may sense the voltage difference and may amplify the voltage difference using the ground voltage when the sensing control signal SAE is enabled at a logic low level.

The precharge circuit 460 may include PMOS transistors 461, 462 and 463. The PMOS transistor 461 may be coupled between a node N21 that is substantially same as the node N11 and a node N23. The PMOS transistor 462 may be coupled between a node N22 that is substantially same as the node N12 and the node N23. The PMOS transistor 463 may be coupled between the node N21 and the node N22 in parallel with the PMOS transistors 461 and 462. A precharge voltage VBL is coupled to the node N23. The first precharge control signal PREC1 may be applied to gates of the PMOS transistors 461 and 463 and the second precharge control signal PREC2 may be applied to a gate of the PMOS transistor 462.

The second precharge control signal PREC2 may transition to an active level simultaneously with the first precharge control signal PREC1 and an activation interval of the second precharge control signal PREC1 may be longer than an activation interval of the first precharge control signal PREC1. Therefore, the PMOS transistor 461 may precharge the bit-line BL to the precharge voltage level VBL in response to the first precharge control signal PREC1 and the PMOS transistor 462 may precharge the complementary bit-line BLB to the precharge voltage level VBL in response to the second precharge control signal PREC2. In addition, a precharging interval of the complementary bit-line BLB may be longer than a precharging interval of the bit-line BL. In addition, the PMOS transistor 463 may couple the bit-line BL and the complementary bit-line BLB in response to the first precharge control signal PREC1 to equalize the bit-line BL and the complementary bit-line BLB.

Figure 14:
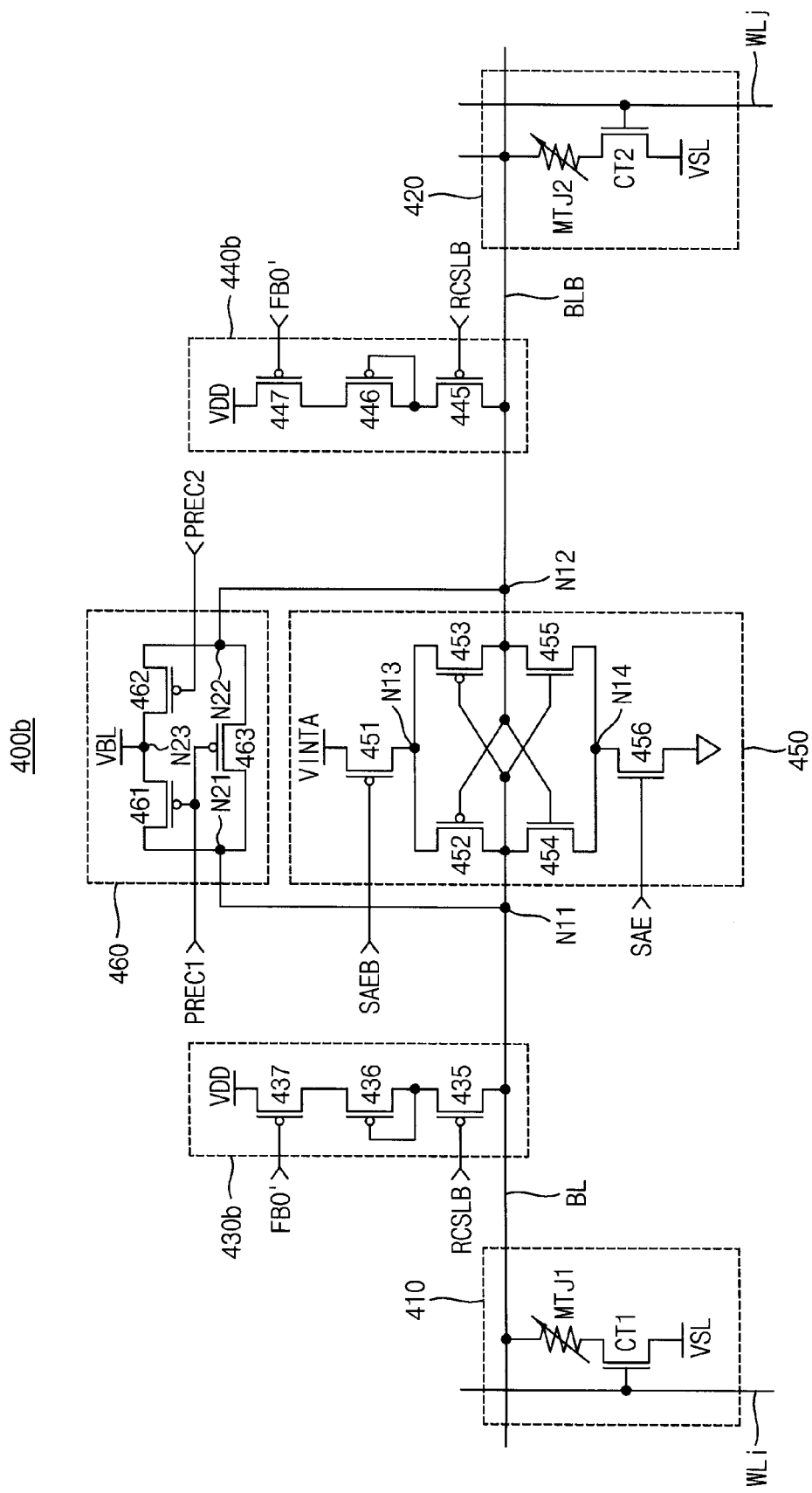
FIG. 14 is a circuit diagram illustrating another example of the memory core of FIG. 12 according to example embodiments.

FIG. 14 is a circuit diagram illustrating another example of the memory core of FIG. 12 according to example embodiments.

Referring to FIGS. 12 and 14, a memory core 400b of a resistive type memory device may include at least a first resistive type memory cell 410, at least a second resistive type memory cell 420, a first resistance to voltage converter 430b, a second resistance to voltage converter 440b, a bit-line sense amplifier 450 and a precharge circuit 460.

The memory core 400b of FIG. 14 is different from the memory core 400a of FIG. 13 in the first resistance to voltage converter 430b and the second resistance to voltage converter 440b.

The first resistance to voltage converter 430b may include PMOS transistors 435, 436 and 437 which are connected in series between the bit-line BL and a power supply voltage VDD (e.g., via a power supply line). The PMOS transistor 435 may be coupled to the bit-line BL, the PMOS transistor 437 may be coupled to the power supply voltage VDD and the PMOS transistor 436 may be coupled between the PMOS transistor 435 and the PMOS transistor 437. The PMOS transistor 435 may have a gate receiving an inverted read column selection signal RCSLB, which is an inverted version of the read column selection signal RCSL. The PMOS transistor 437 may have a gate receiving an inverted bias voltage FBO', which is an inverted version of the bias voltage FBO that has a level to turn-on the PMOS transistor 437. The PMOS transistor 436 may have a gate coupled to a drain of the PMOS transistor 436. The PMOS transistor 436 may be diode-connected. Therefore, the PMOS transistor 436 may operate in a saturation region not in a linear region when the PMOS transistor 435 is turned-on.

The second resistance to voltage converter 440b may include PMOS transistors 445, 446 and 447 which are connected in series between the complementary bit-line BLB and the power supply voltage GND (e.g., via a power supply line). The PMOS transistor 445 may be coupled to the complementary bit-line BLB, the PMOS transistor 447 may be coupled to the power supply voltage VDD and the PMOS transistor 446 may be coupled between the PMOS transistor 445 and the PMOS transistor 447. The PMOS transistor 445 may have a gate receiving the inverted read column selection signal RCSLB. The PMOS transistor 447 may have a gate receiving the inverted bias voltage FBO' that has a level to turn-on the PMOS transistor 447. The PMOS transistor 446 may have a gate coupled to a drain of the PMOS transistor 446. The PMOS transistor 446 may be diode-connected. Therefore, the PMOS transistor 446 may operate in a saturation region not in a linear region when the PMOS transistor 445 is turned-on.

Figure 15:
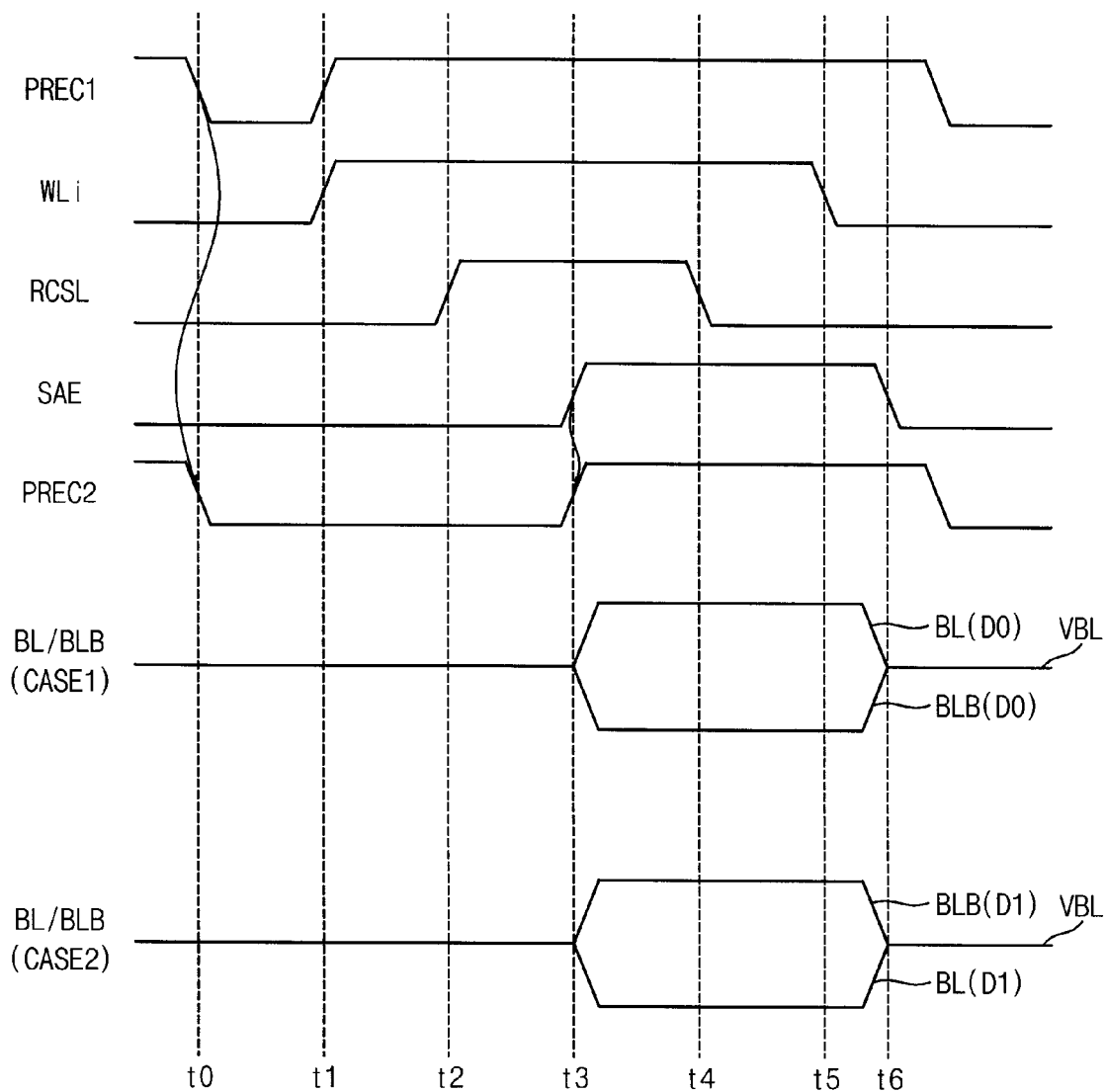
FIG. 15 is a timing diagram illustrating operation of the memory core of the resistive type memory device of FIG. 13 according to example embodiments.

FIG. 15 is a timing diagram illustrating operation of the memory core of the resistive type memory device of FIG. 13.

Referring to FIGS. 13 and 15, at time t0, the first precharge control signal PREC1 and the second precharge control signal PREC2 transition to active levels, and thus the bit-line BL and the complementary bit-line BLB are precharged to the precharge voltage level VBL and equalized. When the first precharge control signal PREC1 is deactivated and the word-line WLi is enabled at time t1, a current starts to flow from the first resistive type memory cell 410 through the MTJ element MTJ1 to the bit-line BL. An amount of the current may be different depending on a level of data written in the MTJ element MTJ1, for example, a state of a resistance of the MTJ element MTJ1. When the read column selection signal RCSL is enabled with a logic high level at time t2, a constant current flows from the first node N11 to the ground voltage through the NMOS transistors 431, 432 and 433 because the NMOS transistor 431 is turned-on and the NMOS transistor 432 operates in the saturation region.

When the MTJ element MTJ1 is in a low resistance state, that is, when data '0' is stored in the first resistive type memory cell 410 in this situation, the MTJ element MTJ1 may increase the voltage level of the bit-line BL in order to match the current flowing through the first resistance to voltage converter 430a. Therefore, the complementary bit-line BLB is maintained at the precharge voltage level VBL and the voltage level of the bit-line BL is increased. When the MTJ element MTJ1 is in a high resistance state, that is, when data '1' is stored in the first resistive type memory cell 410 in this situation, the MTJ element MTJ1 may decrease the voltage level of the bit-line BL in order to match the current flowing through the first resistance to voltage converter 430a. Therefore, the complementary bit-line BLB is maintained at the precharge voltage level VBL and the voltage level of the bit-line BL is decreased.

When the sensing enable signal SAE is activated and the second precharge control signal PREC2 is deactivated with a high level in response to the sensing enable signal SAE at time t3, the PMOS transistor 451 and the NMOS transistor 456 are turned-on and the bit-line sense amplifier 450 amplifies the voltage difference of the bit-line BL and the complementary bit-line BLB. When the read column selection signal RCSL is deactivated with low level at time t4, the NMOS transistor 431 is turned-off. When the word-line WLi is deactivated at time t5, the cell transistor CT1 is turned-off and the current from the first resistive type memory cell 410 to the bit-line BL is cut-off. When the sensing enable signal SAE is deactivated at time t6, the bit-line sense amplifier 450 finishes sensing operation. After time t6, the first precharge control signal PREC1 and the second precharge control signal PREC2 transition to active levels again and the bit-line BL and the complementary bit-line BLB are precharged and equalized for next read operation.

In FIG. 15, a first case CASE1 denotes a case when the MTJ element MTJ1 is in a low resistance state, that is, when data '0' is stored in the first resistive type memory cell 410. In addition, a second case CASE2 denotes a case when the MTJ element MTJ1 is in a high resistance state, that is, when data '1' is stored in the first resistive type memory cell 410.

Figure 16:
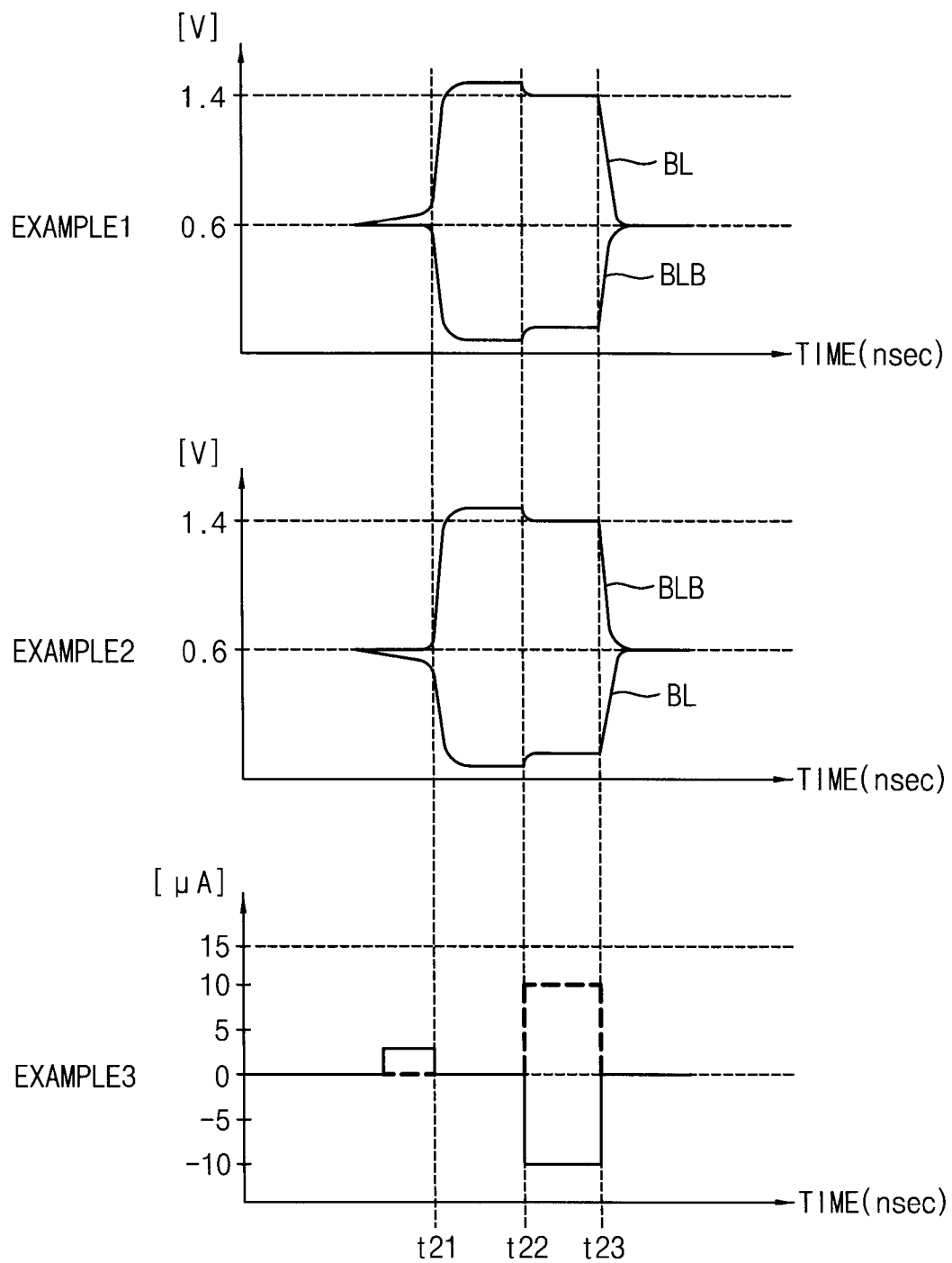
FIG. 16 illustrates voltages of the bit-line and the complementary bit-line and a current of the first resistive type memory cell in the memory core of FIG. 13 according to example embodiments.

FIG. 16 illustrates voltages of the bit-line and the complementary bit-line and a current of the first resistive type memory cell in the memory core of FIG. 13.

In FIG. 16, a first example EXAMPLE1 represents voltage change of the bit-line BL and the complementary bit-line BLB when data '0' is stored in the first resistive type memory cell 410, a second example EXAMPLE2 represents voltage change of the bit-line BL and the complementary bit-line BLB when data '1' is stored in the first resistive type memory cell 410 and a third example EXAMPLE3 represents cell current of the first resistive type memory cell 410. In the third example EXAMPLE3, a solid line represents change of the cell current when data '0' is stored in the first resistive type memory cell 410 and a dotted line represents change of the cell current when data '1' is stored in the first resistive type memory cell 410.

Referring to FIGS. 13 and 16, sensing operation begins when the sensing control signal SAE is activated at time t21. A current is provided from the first resistive type memory cell 410 to the bit-line BL as the solid line indicates when data '0' is stored in the first resistive type memory cell 410 or current sinks from the bit-line BL to the first resistive type memory cell 410 as the dotted line indicates when the read column selection signal RCSL is deactivated at time t22. The sensing operation is over when the sensing control signal SAE is deactivated at time t23.

As described above, the memory core 400 of the resistive type memory device includes resistance to voltage converts 430 and 440 that convert resistance corresponding data stored in the resistive type memory cell to a corresponding voltage and the bit-line sense amplifier 450 that has a cross-coupled latch, and thus the memory core 400 may enhance performance by obtaining enough sensing margin without regard to variance of process and signals without generating extra reference current or reference voltage and may increase integration rate due to simple configuration of the bit-line sense amplifier 450. In addition, since the precharge circuit 460 maintains the complementary bit-line BLB to the precharge voltage level VBL longer than the bit-line BL, the voltage of the complementary bit-line BLB may serve as a reference voltage stably in the sensing operation.

Figure 17:
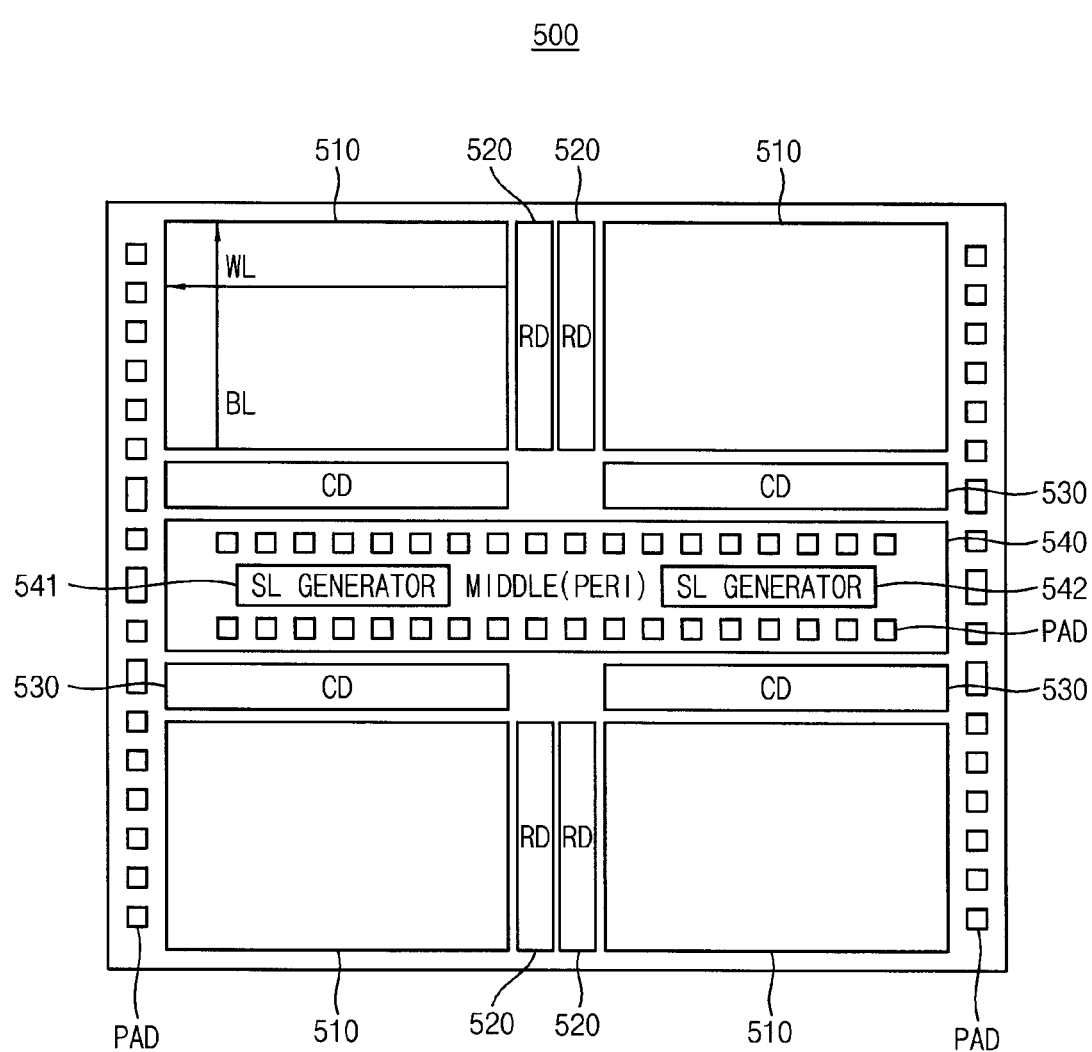
FIG. 17 illustrates a layout of a resistive type memory device according to example embodiments.

FIG. 17 illustrates a layout of a resistive type memory device according to example embodiments.

Referring to FIG. 17, a resistive type memory device 500 may include four bank arrays 510. A plurality of sub array blocks including a plurality of STT-MRAM cells may be disposed in each of the bank arrays 510. A row decoder 520 and a column decoder 530 may be disposed adjacent to each of the bank arrays 510. Also, pads PAD used to communicate with the outside may be disposed in peripheral regions disposed in the edges and center of the resistive type memory device 500. Furthermore, source line voltage generators 541 and 542 may be disposed in the peripheral region disposed in the center of the resistive type memory device 500. The row decoders 520, the column decoders 530, and the source line voltage generators 541 and 542 may constitute peripheral circuits.

Although FIG. 17 shows an embodiment in which two source line voltage generators 541 and 542 are provided, source line voltage generators may be provided in equal number to the number of bank arrays 510 so that source line driving voltages can be respectively applied to the bank arrays 510.

The row decoders 520 may be disposed in a word-line direction of the resistive type memory device 500, while the column decoders 530 may be disposed in a bit-line direction thereof. Furthermore, the row decoders 520 allocated respectively to two adjacent bank arrays 1310 may be disposed adjacent to each other and share a control line (not shown) therebetween.

Figure 18:
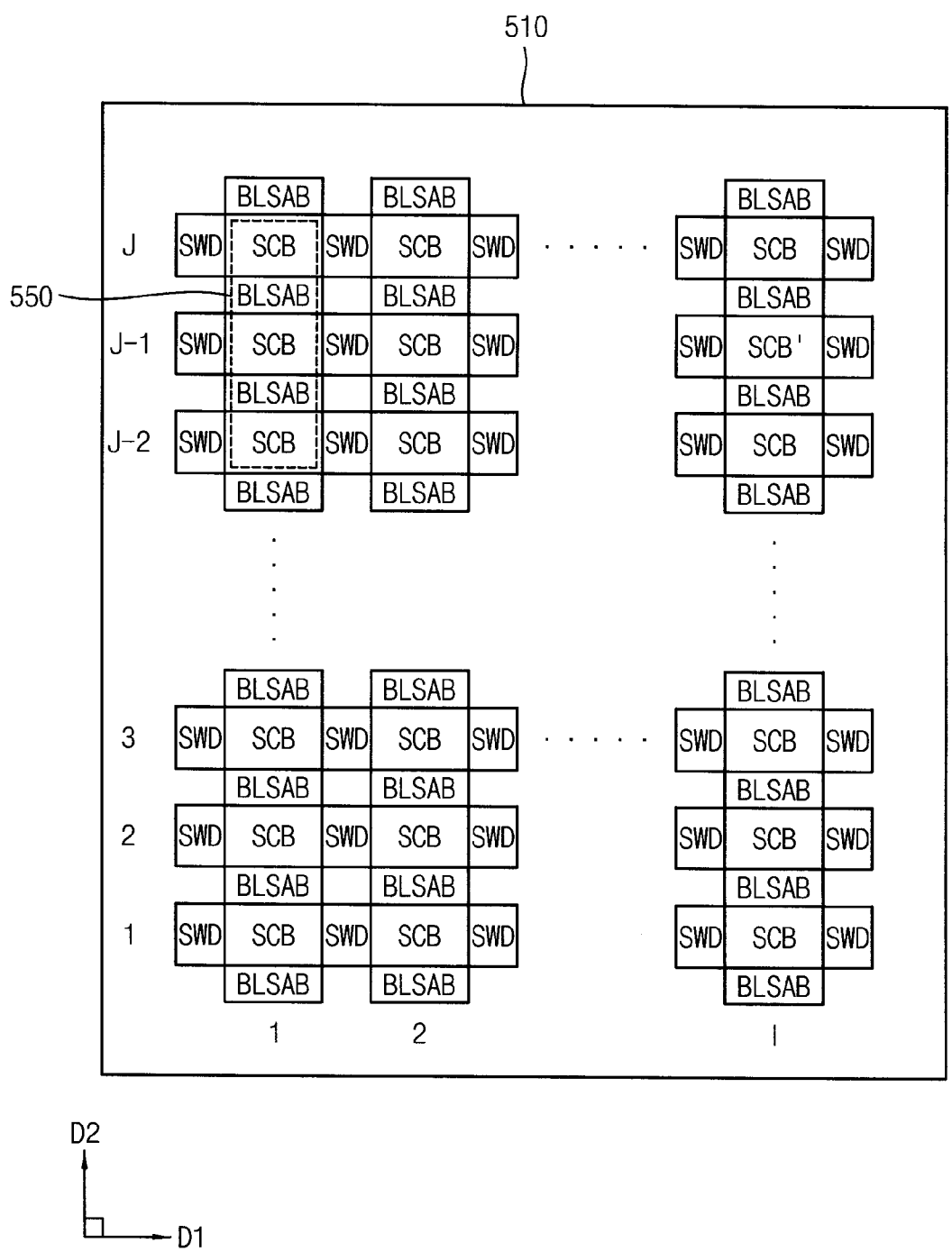
FIG. 18 illustrates a layout of the bank array in FIG. 17 according to example embodiments.

FIG. 18 illustrates a layout of a bank array in FIG. 17 according to example embodiments.

Referring to FIG. 18, in the bank array 510, I sub array blocks SCB may be disposed in a first direction D1, and J sub array blocks SCB may be disposed in a second direction D2 orthogonal to the first direction. A plurality of bit-lines, a plurality of word-lines, and a plurality of STT-MRAM cells may be disposed in each of the sub array blocks SCB. The plurality of STT-MRAM cells may be disposed at intersections between the bit-lines and the word-lines.

I+1 sub word-line driver regions SWD may be disposed between the sub array blocks SCB in the first direction D1. Sub word-line drivers may be disposed in the sub word-line driver regions SWD.

J+1 bit-line sense amplifier regions BLSAB may be disposed along the sub array blocks SCB in the second direction D2 (e.g., with a bit-line sense amplifier region BLSAB occupying each space between sub array blocks SCB, and a bit-line sense amplifier region BLSAB at either end of a group of sub array blocks SCB in the second direction D2. Bit-line sense amplifier circuits to sense data stored in resistive type memory cells may be disposed in the bit-line sense amplifier regions BLSAB. For example, the sense amplifier circuits 405 in FIG. 12 may be disposed in the bit-line sense amplifier regions BLSAB. As such, first and second resistance to voltage converters, a bit-line sense amplifier and a precharge circuit may be disposed in the bit-line sense amplifier regions BLSAB.

Figure 19:
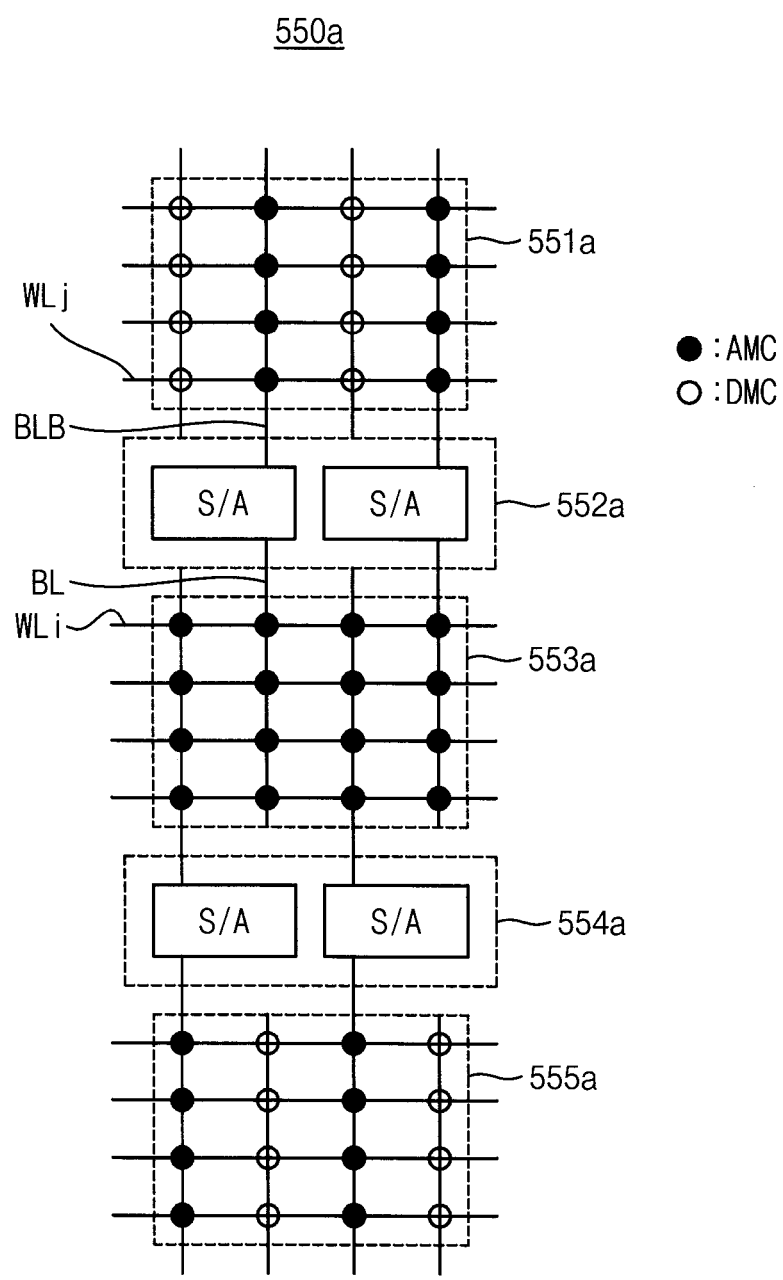
FIG. 19 illustrates an example of a portion of the bank array in FIG. 18 in detail.

FIG. 19 illustrates an example of a portion of the bank array in FIG. 18 in detail.

Referring to FIGS. 18 and 19, in a portion 550a of the bank array 510, sub array blocks 551a, 553a and 555a and bit-line sense amplifier regions 552a and 554a may be disposed. Active memory cells AMC in the sub array block 551a may be connected to the sense amplifier circuits S/A in the bit-line sense amplifier blocks 552a. Active memory cells AMC in the sub array block 553a may be connected to the sense amplifier circuits S/A in the adjacent bit-line sense amplifier blocks 552a and 554a. In addition, active memory cells AMC in the sub array block 555a may be connected to the sense amplifier circuits S/A in the bit-line sense amplifier blocks 554a by corresponding column selection switches (not illustrated). Inactive memory cells DMC are not connected to the sense amplifier circuits S/A by corresponding column selection switches (not illustrated).

In FIG. 19, one active resistive type memory cell (for example, the first resistive type memory cell 410 in FIG. 12) coupled to the bit-line BL and other active resistive type memory cell (for example, the second resistive type memory cell 420 in FIG. 12) coupled to the complementary BLB are respectively disposed in different sub array blocks with regard to the sense amplifier circuit S/A (for example, the sense amplifier circuit 405 in FIG. 12) in the bit-line sense amplifier region 552a. Therefore, FIG. 19 illustrates open bit-line architecture.

When the resistive type memory device 500 employs the open bit-line architecture of FIG. 19, an integration rate may be increased because area occupied by the cell array block is reduced. When the open bit-line architecture of FIG. 19 is employed, edge sub array blocks that are not used may be included for load balancing. However, the resistive type memory device 500 does not need to include the edge sub array blocks because the precharge voltage level of the complementary bit-line is stably maintained when the resistive type memory device 500 employs precharge circuit 460 in FIG. 13.

Figure 20:
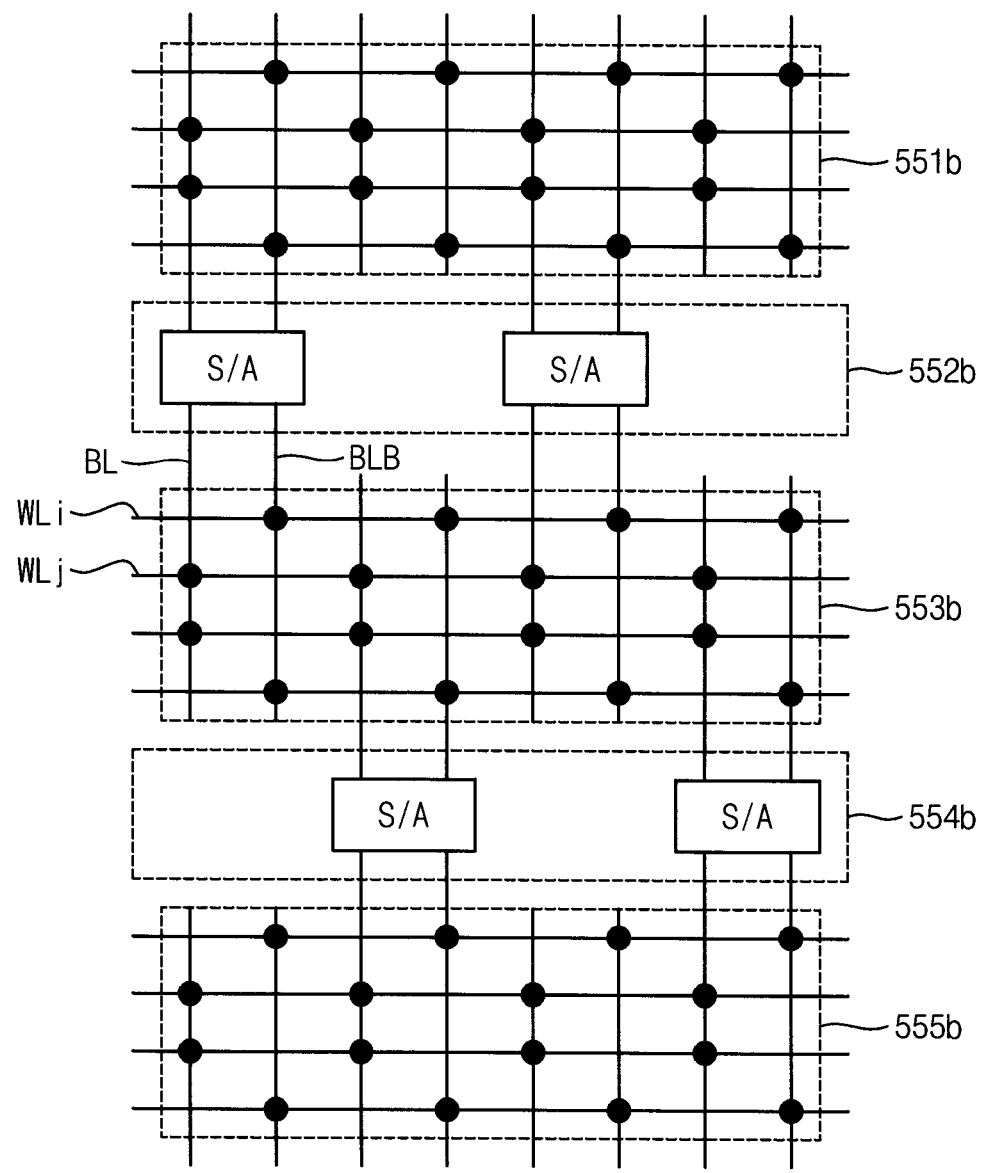
FIG. 20 illustrates another example of a portion of the bank array in FIG. 18 in detail.

FIG. 20 illustrates another example of a portion of the bank array in FIG. 18 in detail.

Referring to FIGS. 18 and 20, in a portion 550b of the bank array 510, sub array blocks 551b, 553b and 555b and bit-line sense amplifier regions 552b and 554b may be disposed. Some of active memory cells AMC in the sub array block 551b may be connected to the sense amplifier circuits S/A in the bit-line sense amplifier blocks 552b. Active memory cells AMC in the sub array block 553b may be connected to the sense amplifier circuits S/A in the adjacent bit-line sense amplifier blocks 552b and 554b. In addition, some of active memory cells AMC in the sub array block 555b may be connected to the sense amplifier circuits S/A in the bit-line sense amplifier blocks 554b.

In FIG. 20, one active resistive type memory cell (for example, the first resistive type memory cell 410 in FIG. 12) coupled to the bit-line BL and another active resistive type memory cell (for example, the second resistive type memory cell 420 in FIG. 12) coupled to the complementary BLB are disposed in a same sub array block with regard to the sense amplifier circuit S/A (for example, the sense amplifier circuit 405 in FIG. 12) in the bit-line sense amplifier region 552b. Therefore, FIG. 20 illustrates folded bit-line architecture. As can be seen from the folded bit-line architecture, both a bit line and a complementary bit line connected to a sense amplifier circuit S/A are at a same side of the sense amplifier circuit S/A. On the contrary, in an open bit-line architecture, a bit line and complementary bit line connected to the same sense amplifier circuit S/A are at opposite sides of the sense amplifier circuit S/A. Also, as can be seen, as opposed to the example in FIG. 19, the example of FIG. 20 does not include any inactive memory cells.

When the resistive type memory device 500 employs the folded bit-line architecture of FIG. 20, noise immunity may be enhanced.

Figure 21:
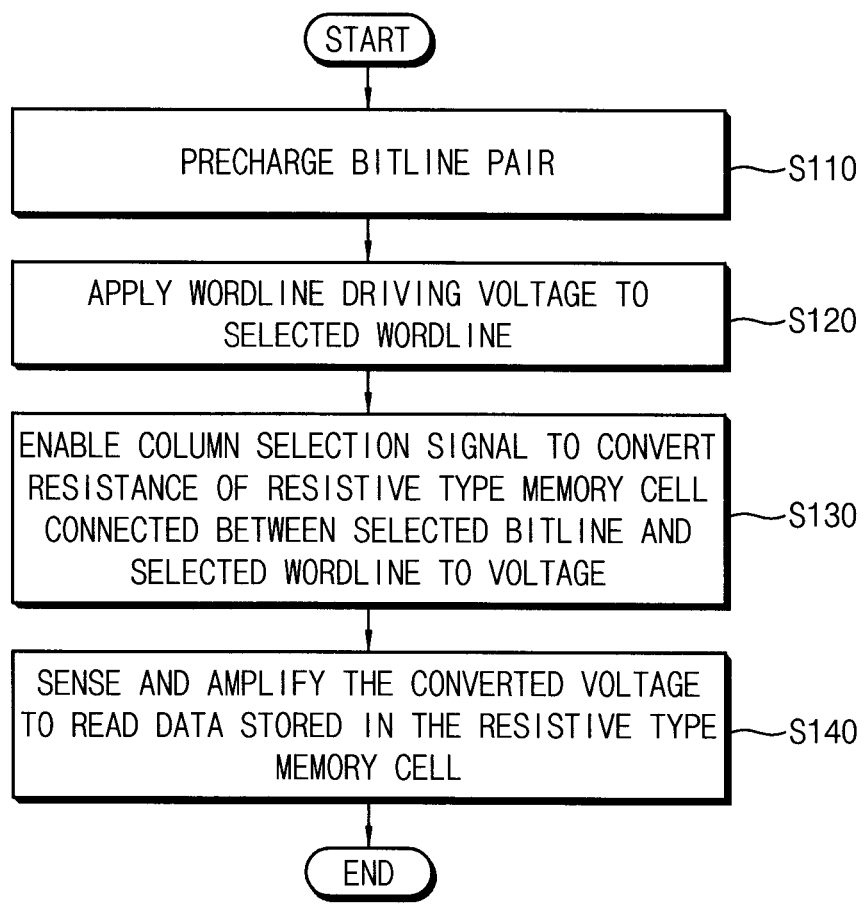
FIG. 21 is a flow chart illustrating a method of sensing data in a resistive type memory device according to example embodiments.

FIG. 21 is a flow chart illustrating a method of sensing data in a resistive type memory device according to example embodiments.

Referring to FIGS. 3 through 16 and 21, for sensing data in a resistive type memory device, the bit-line BL coupled to the first resistive type memory cell 410 and the complementary bit-line BLB coupled to the second resistive type memory cell 420 are precharged (S110). The bit-line BL and the complementary bit-line BLB may constitute a bit-line pair. In certain embodiments, each of the first resistive type memory cell 410 and the second resistive type memory cell 420 may be an STT-MRAM cell including the MTJ element MTJ and the cell transistor CT as described above. The precharge operation may be performed by the precharge circuit 460 in response to the first and second precharge control signals PREC1 and PREC2. The precharging interval of the complementary bit-line BLB may be longer than precharging interval of the bit-line BL.

For reading data stored in the first resistive type memory cell 410, a word-line driving voltage is applied to a selected word-line WLi coupled to the first resistive type memory cell 410 to enable the selected word-line WLi (S120). The read column selection signal RCSL is enabled to convert a resistance of the first resistive type memory cell 410 to a corresponding voltage (S130). The read column selection signal RCSL is applied to the gate of the NMOS transistor 431 in the first resistance to voltage converter 430.

The converted voltage may be sensed and amplified by the bit-line sense amplifier 450 to read data stored in the first resistive type memory cell 410 (S140). When the MTJ element MTJ1 is in a low resistance state, for example, when data '0' is stored in the first resistive type memory cell 410, the voltage level of the bit-line BL is increased and when the MTJ element MTJ1 is in a high resistance state, for example, when data '1' is stored in the first resistive type memory cell 410, the voltage level of the bit-line BL is decreased as described with reference to FIG. 15.

Figure 22:
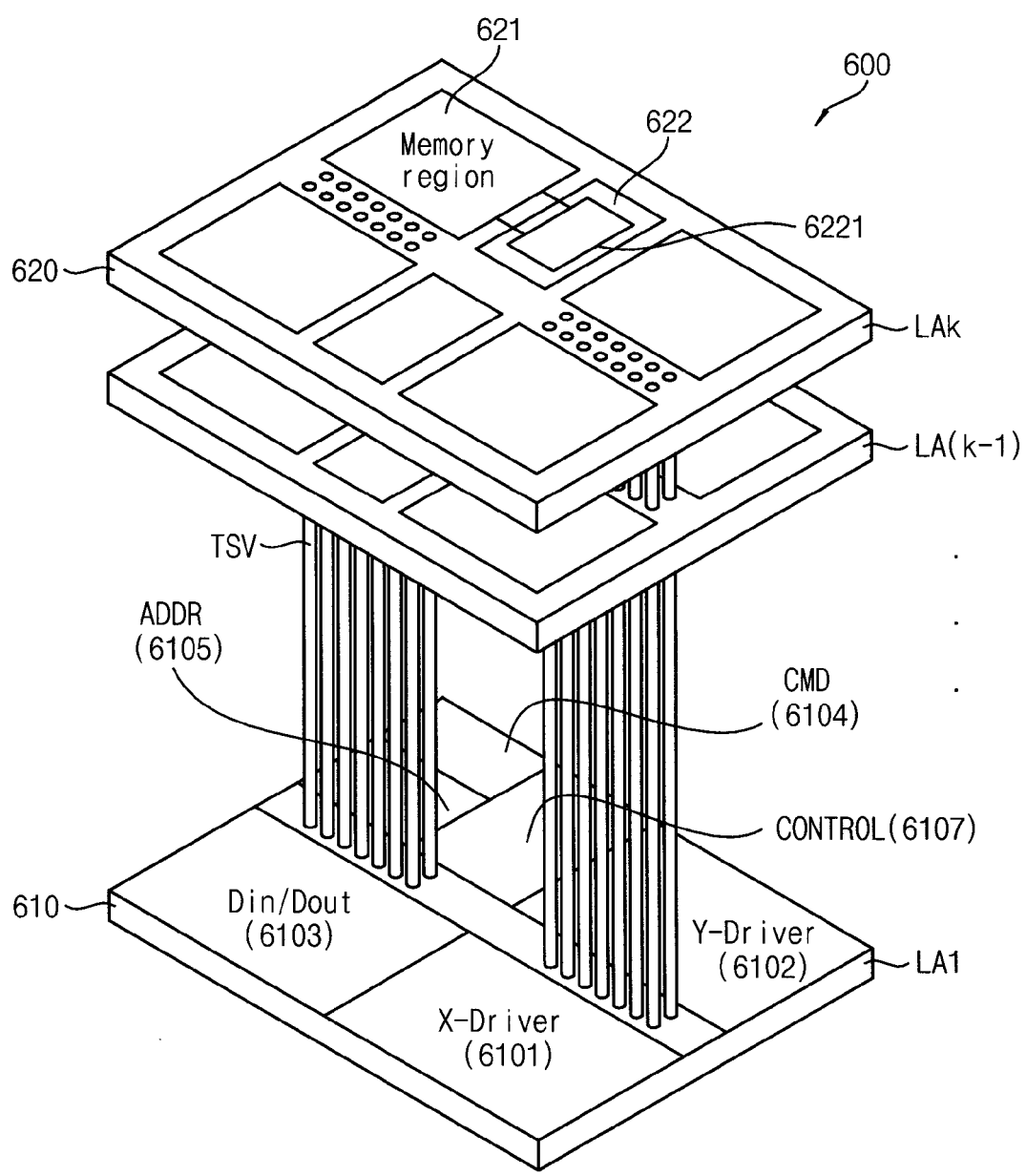
FIG. 22 is a structural diagram illustrating a resistive type memory device according to example embodiments.

FIG. 22 is a structural diagram illustrating a semiconductor device, which may be a resistive type memory device according to example embodiments. As described herein, a semiconductor device may refer to any of the various devices described in connection with FIGS. 2-23. A semiconductor device may refer, for example, to a device such as a semiconductor chip (e.g., memory chip and/or logic chip formed on a die from a wafer), a stack of semiconductor chips, a semiconductor package including one or more semiconductor chips stacked on a package substrate, or a package-on-package device including a plurality of packages. A semiconductor device may refer generally to a memory device, such as a memory chip, or a control device, such as a controller chip, or a combination thereof. The semiconductor devices described herein may be formed using ball grid arrays, wire bonding, through substrate vias, or other electrical connection elements, and may include memory devices such as volatile or non-volatile memory devices. An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 22, a semiconductor device such as a resistive type memory device 600 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. As such, in one embodiment, each integrated circuit layer may be formed on a single chip, e.g., formed from a wafer. In one embodiment, the first through kth semiconductor integrated circuit layers LA1 through LAk may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the resistive type memory device 600 by mainly using the first semiconductor integrated circuit layer LA1 or 610 as the interface or control chip and the nth semiconductor integrated circuit layer LAk or 620 as the slave chip. Nonetheless, it should be noted that the interface or control chip need not be the bottom chip of the stack, and can be located at other vertical locations within the stack of chips, or even horizontally adjacent to one of the slave chips.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of sub array blocks as described with reference to FIGS. 17 through 20, and each of the sub array blocks may include a plurality of resistive type memory cells as described with reference to FIG. 6 through 11B.

The first semiconductor integrated circuit layer 610 may further include a control logic 6107. The control logic 6107 may control an access to the memory region 621 based on a command and an address signal from a memory controller and may generate control signals for accessing the memory region 621.

The kth semiconductor integrated circuit layer 620 may include the memory regions 621 including a resistive type memory call array and peripheral circuit regions 622 in which peripheral circuits for reading/writing data of the memory regions 621, e.g., a row decoder, a column decoder, a sense amplifier circuit 6221, etc. (not illustrated) are arranged. The sense amplifier circuit 6221 may include resistance to voltage converts, a bit-line sense amplifier, and a precharge circuit as described with reference to FIGS. 12 through 16, and thus may enhance performance by obtaining enough sensing margin without regard to variance of process and signals without generating extra reference current or reference voltage and may increase integration rate due to a simple configuration.

Figure 23:
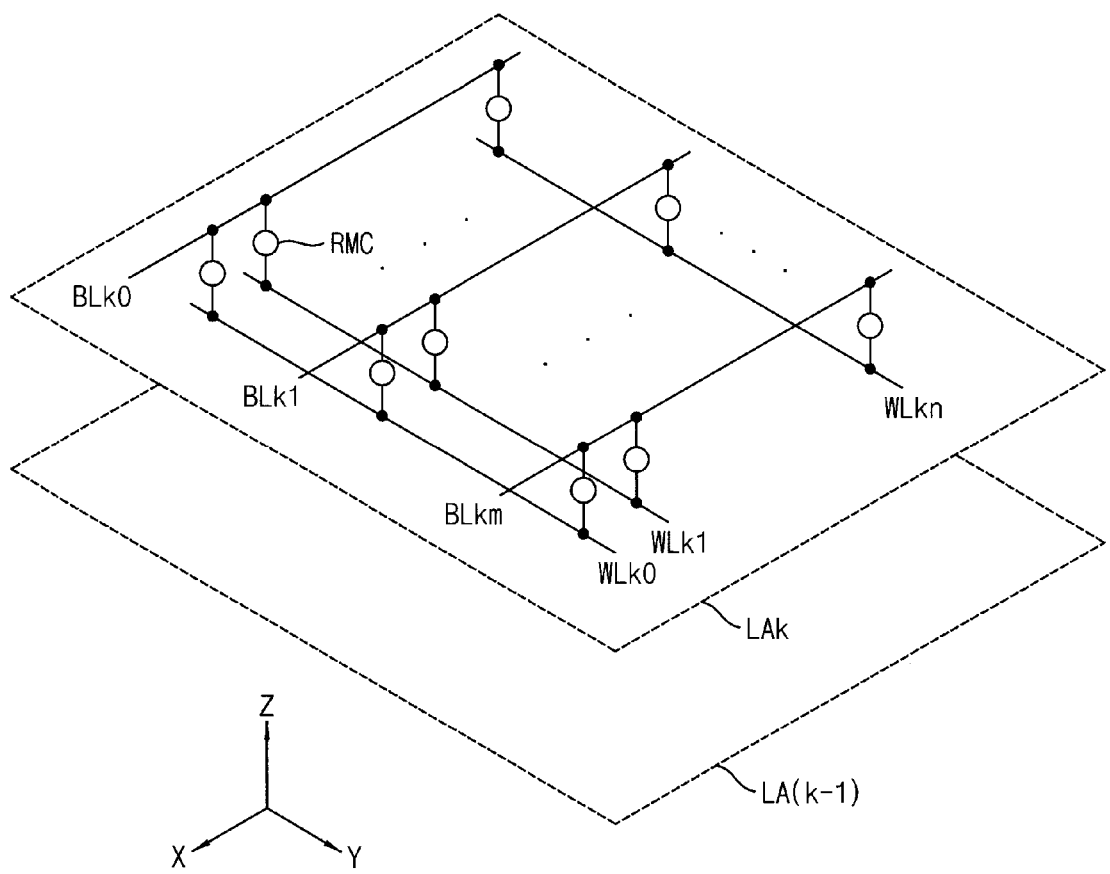
FIG. 23 illustrates configuration of the semiconductor integrated circuit layers in FIG. 22.

FIG. 23 illustrates an exemplary configuration of the semiconductor integrated circuit layers in FIG. 22.

In FIG. 23, the kth semiconductor integrated circuit layer LAk is illustrated in detail. Each configuration of other semiconductor integrated circuit layers LA2~LA(k–1) may be similar to the configuration of the kth semiconductor integrated circuit layer LAk.

Referring to FIG. 23 the kth semiconductor integrated circuit layer LAk may include a plurality of (e.g., m+1) bit-lines BLk0 to BLkm disposed lengthwise in the X axis direction with a predetermined space therebetween and a plurality of (e.g., n+1) word-lines WLk0 to WLkn disposed lengthwise in the Y axis direction with a predetermined space therebetween. A resistive type memory cell RMC may be disposed at each of intersection points of the word-lines WLk0 to WLkn and the bit-lines BLk0 to BLkm. The resistive type memory cell RMC may include an STT-MRAM cell as described with reference to FIGS. 6 through 11B. In addition, although not illustrated, a sense amplifier circuit may be disposed in peripheral circuit regions in the kth semiconductor integrated circuit layer LAk as described with reference to FIGS. 12 through 16.

Figure 24:
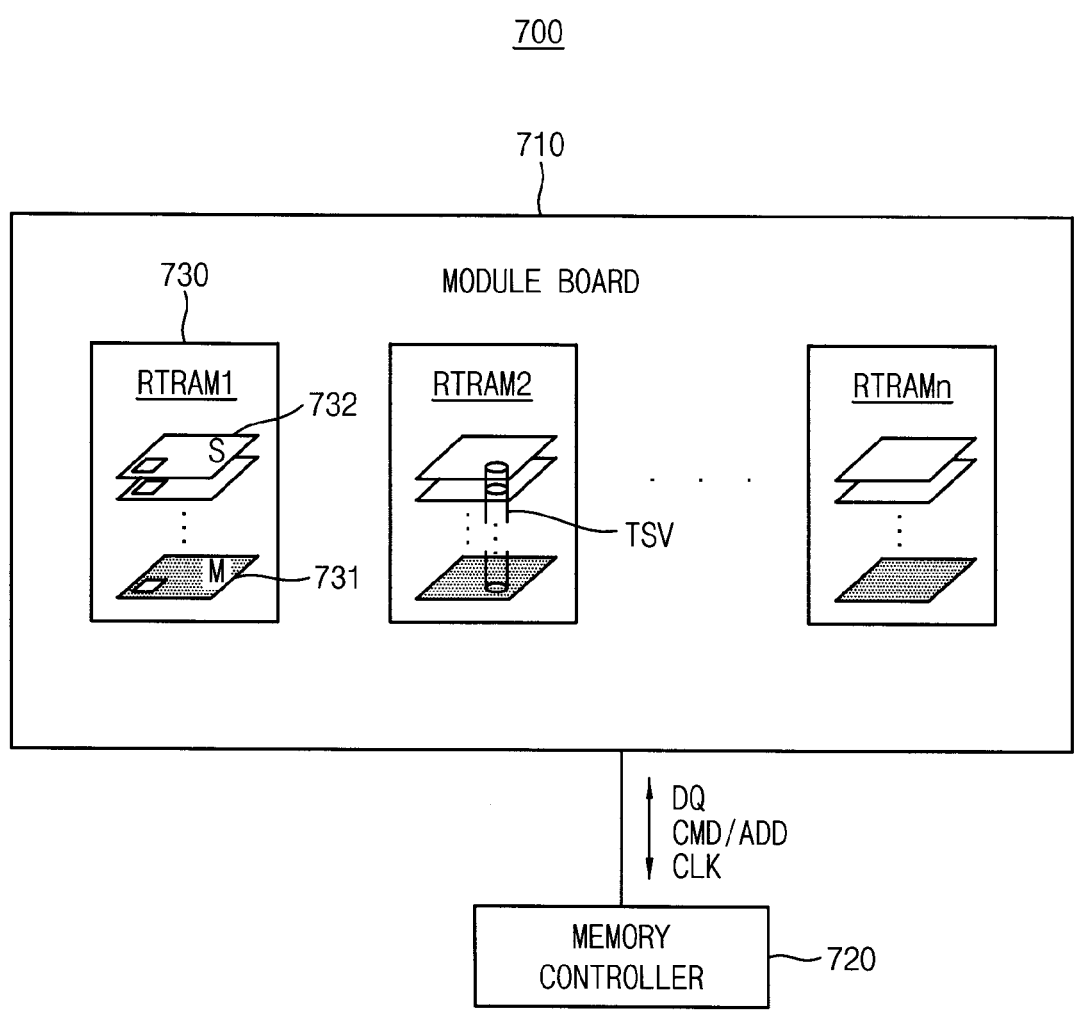
FIG. 24 illustrates a memory system including a resistive type memory device according to example embodiments.

FIG. 24 illustrates a memory system including the resistive type memory device according to example embodiments.

Referring to FIG. 24, a memory system 700 may include a memory module 710 and a memory controller 720. The memory module 710 may include at least one resistive type memory device 730 mounted on a module board. The resistive type memory device 730 may employ the resistive type memory device 200a of FIG. 3. For example, the resistive type memory device 730 may be constructed as a MRAM chip. In addition, the resistive type memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the resistive type memory device 200a of FIG. 3. Therefore, each of the master chip 731 and the slave chip 732 may include a cell array including a plurality of STT-MRAM cells and a sense amplifier circuit disposed in a peripheral region as described with reference to FIGS. 5 through 11B. The sense amplifier circuit may include resistance to voltage converter, a bit-line sense amplifier, and a precharge circuit as described with reference to FIGS. 12 through 16, and thus may enhance performance by obtaining enough sensing margin without regard to variance of process and signals without generating extra reference current or reference voltage and may increase integration rate due to a simple configuration.

The memory module 710 may communicate with the memory controller 720 via a system bus. Data DQ, a command/address CMD/ADD, and a clock signal CLK may be transmitted and received between the memory module 710 and the memory controller 720 via the system bus.

Figure 25:
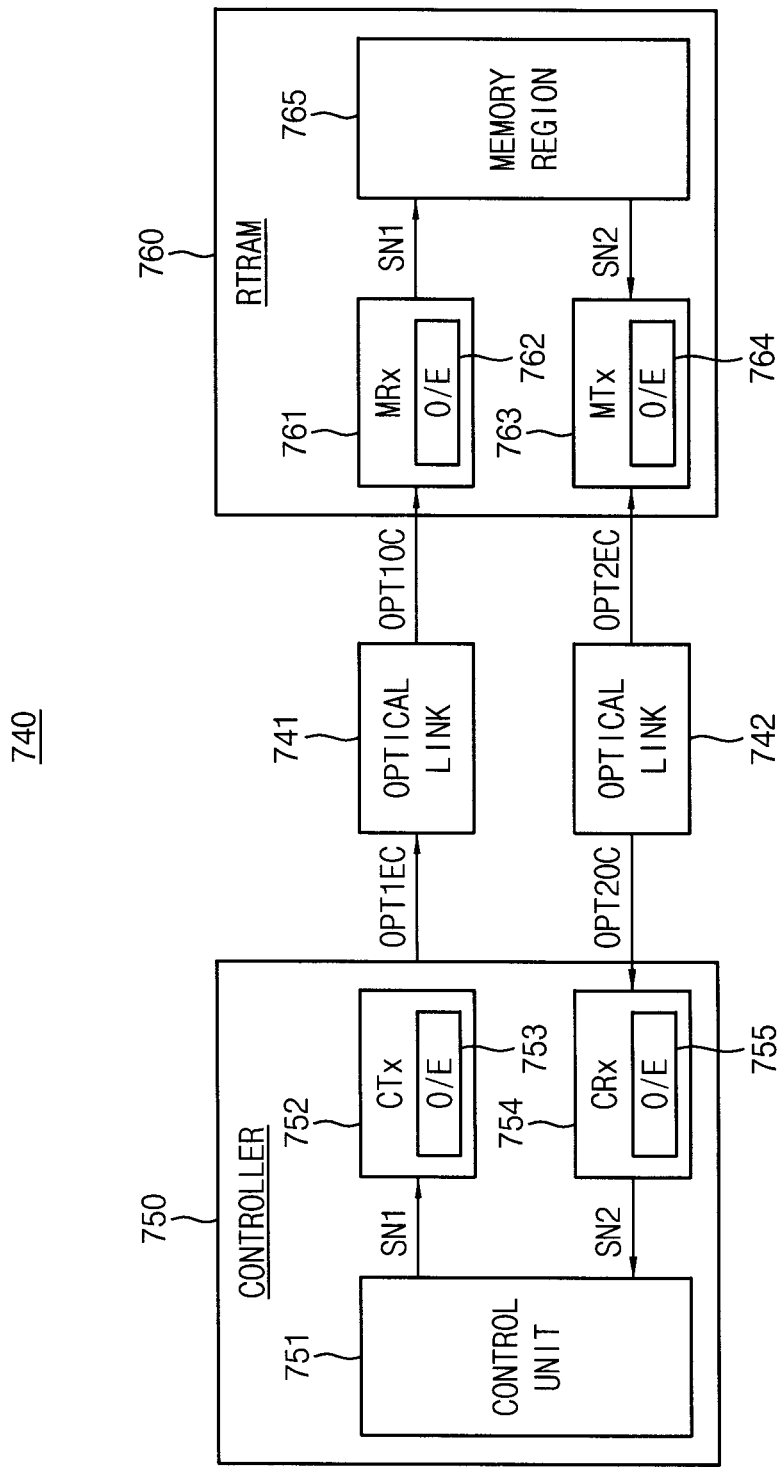
FIG. 25 is a block diagram illustrating a memory system including a resistive type memory device according to example embodiments.

FIG. 25 is a block diagram illustrating a memory system including the resistive type memory device according to example embodiments.

Referring to FIG. 25, a memory system 730 may include optical links 741 and 742, a controller 750, and a resistive type memory device 760. The optical links 741 and 742 interconnect the controller 750 and the resistive type memory device 760. The controller 750 may include a control unit 751, a first transmitter 752, and a first receiver 754. The control unit 751 may transmit a first electrical signal SN1 to the first transmitter 752. The first electrical signal SN1 may include command signals, clock signals, address signals, or write data transmitted to the resistive type memory device 760.

The first transmitter 752 may include a first optical modulator 753, and the first optical modulator 753 may convert the first electrical signal SN1 into a first optical transmission signal OTP1EC and may transmit the first optical transmission signal OTP1EC to the optical link 741. The first optical transmission signal OTP1EC may be transmitted by serial communication through the optical link 741. The first receiver 754 may include a first optical demodulator 755, and the first optical demodulator 755 may convert a second optical reception signal OPT2OC received from the optical link 742 into a second electrical signal SN2 and may transmit the second electrical signal SN2 to the control unit 750.

The resistive type memory device 760 may include a second receiver 761, a memory region 765 including STT MRAM cells, and a second transmitter 764. Also, the resistive type memory device 760 may include an interface unit that provides various interface functions. The second receiver 761 may include a second optical demodulator 762, and the second optical demodulator 762 may convert the first optical reception signal OPT1OC received from the optical link 741 into the first electrical signal SN1 and may transmit the first optical reception signal OPT1OC to the memory region 765.

In the memory region 765, write data is written to the STT MRAM cells in response to the first electrical signal SN1, or data read from the memory region 765 is transmitted as a second electrical signal SN2 to the second transmitter 764. In the memory region 765, a plurality of resistive type memory cells and sense amplifier circuits including first and second resistance to voltage converters, a bit-line sense amplifier, and a precharge circuit may be disposed. Therefore, the resistive type memory device 760 may enhance performance by obtaining enough sensing margin without regard to variance of process and signals without generating extra reference current or reference voltage and may increase integration rate due to simple configuration. The second electrical signal SN2 may include clock signals and read data transmitted to the memory controller 750. The second transmitter 763 may include a second optical modulator 764, and the second optical modulator 764 may convert the second electrical signal SN2 into the second optical data signal OPT2EC and transmit the second optical data signal OPT2EC to the optical link 742. The second optical transmission signal OTP2EC may be transmitted by serial communication through the optical link 742.

Figure 26:
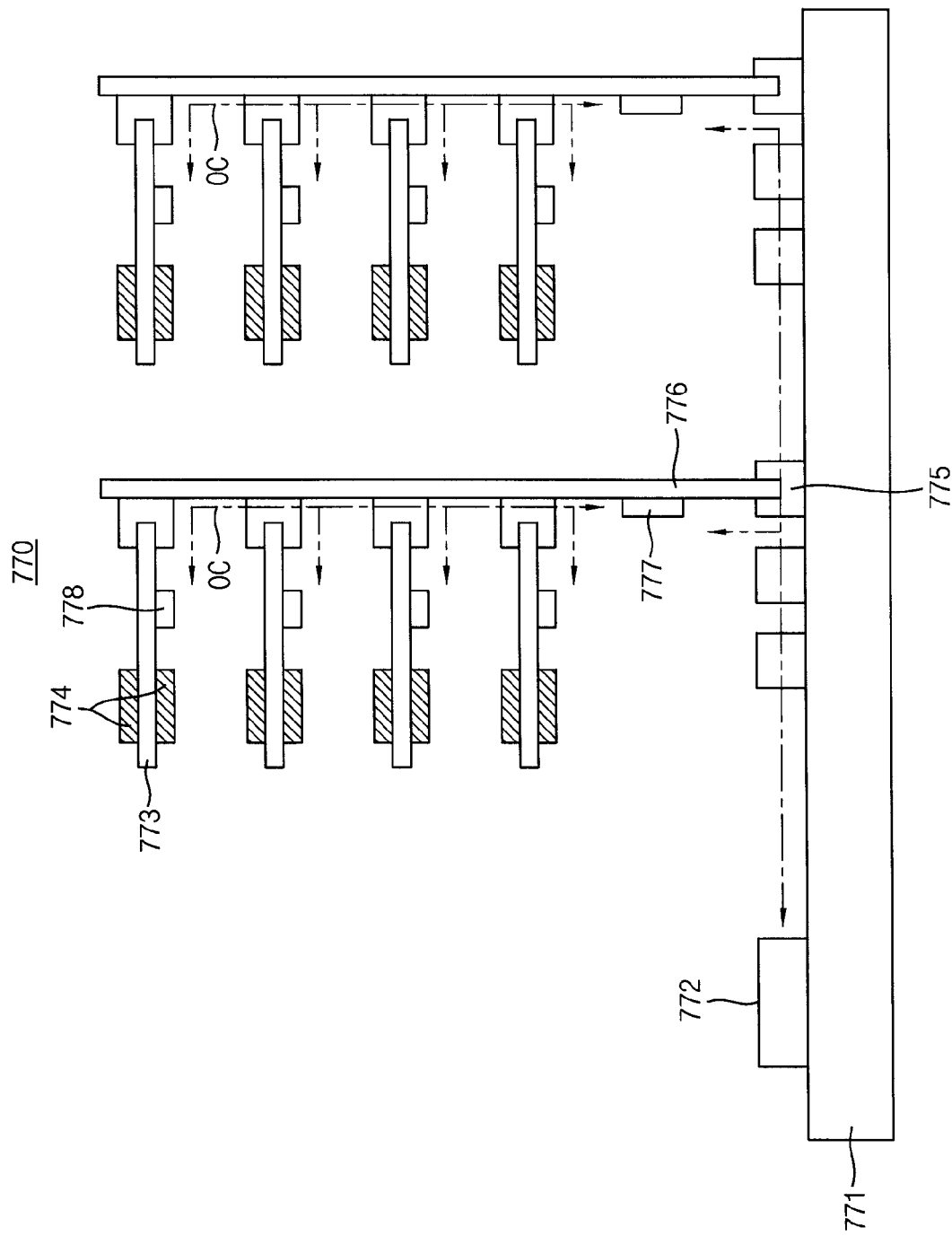
FIG. 26 is a block diagram illustrating a server system including a resistive type memory device according to example embodiments.

FIG. 26 is a block diagram illustrating a server system including a resistive type memory device according to example embodiments.

Referring to FIG. 26, a server system 770 includes a memory controller 772 and a plurality of memory modules 773. Each of the memory modules 773 may include a plurality of resistive type memory devices 774. The resistive type memory devices 774 may include a memory region including STT-MRAM cells and a sense amplifier circuit that sense data in the STT-MRAM cells. The sense amplifier circuit may include first and second resistance to voltage converters, a bit-line sense amplifier, and a precharge circuit. Therefore, the resistive type memory device 774 may enhance performance by obtaining enough sensing margin without regard to variance of process and signals without generating extra reference current or reference voltage and may increase integration rate due to simple configuration.

In the server system 770, a second circuit board 776 is coupled to each of sockets 775 of a first circuit board 771. The server system 770 may be designed to have a channel structure in which one second circuit board 776 is connected to the first circuit board 771 according to signal channels.

Meanwhile, a signal of the memory modules 773 may be transmitted via an optical IO connection. For the optical IO connection, the server system 770 may further include an electric-to-optical conversion unit 777, and each of memory modules 773 may further include an optical-to-electrical conversion unit 778.

The memory controller 772 is connected to the electric-to-optical conversion unit 777 through an electrical channel EC. The electric-to-optical conversion unit 777 converts an electrical signal received from the memory controller 772 through the electrical channel EC into an optical signal and transmits the optical signal to an optical channel OC. Also, the electric-to-optical conversion unit 777 converts an optical signal received through the optical channel OC into an electrical signal and transmits the electrical signal to the electrical channel EC.

The memory module 773 is connected to the electric-to-optical conversion unit 777 through the optical channel OC. An optical signal applied to the memory module 773 may be converted into an electrical signal through the optical-to-electric conversion unit 778 and may be transmitted to the resistive type memory chips 774. The server system 770 including the optical connection memory modules may support high storage capacity and a high processing speed.

Figure 27:
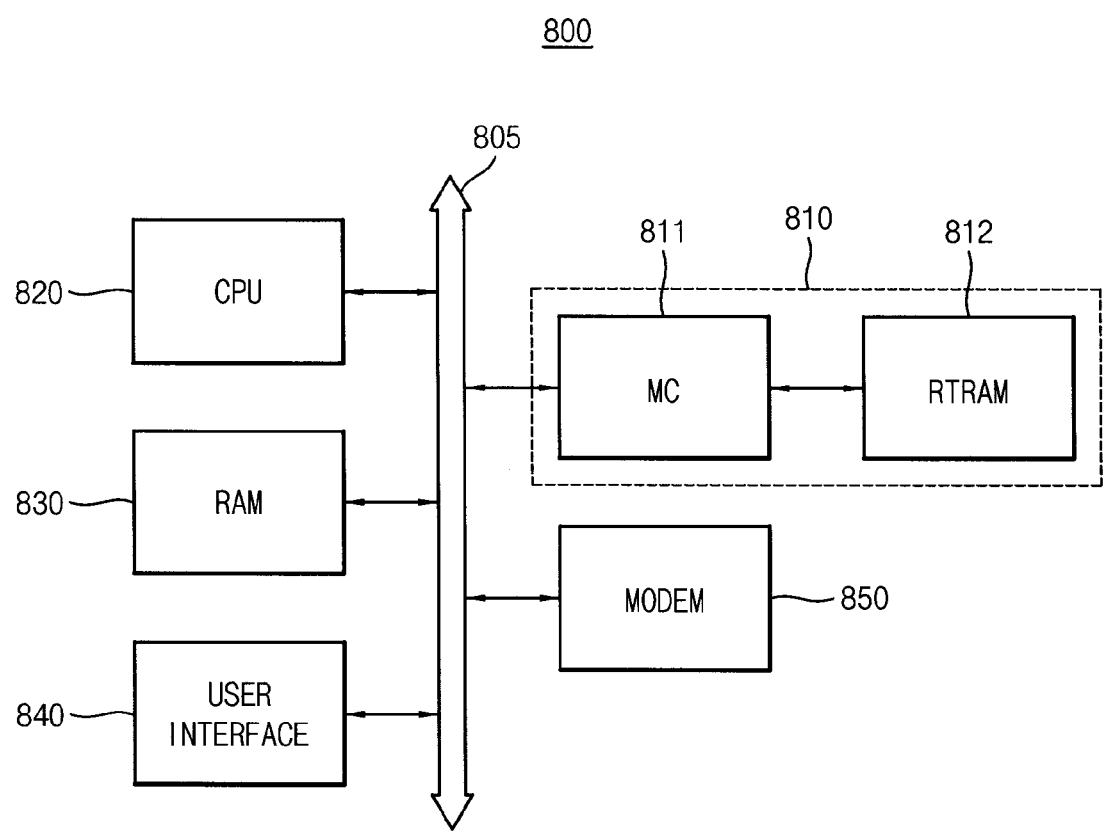
FIG. 27 is a block diagram illustrating a computing system including a resistive type memory device according to example embodiments.

FIG. 27 is a block diagram illustrating a computing system including the resistive type memory device according to example embodiments.

Referring to FIG. 27, a computing system 800 may be included in an electronic device such as a mobile device or a desktop computer. The computing system 800 may include resistive type memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the resistive type memory system 810.

The resistive type memory system 810 may include a resistive type memory device 812 and a memory controller 811. Data processed by the CPU 820 or external data is stored in the resistive type memory device 812. The resistive type memory device 812 may include STT-MRAM cells and a sense amplifier circuit that sense data in the STT-MRAM cells. The sense amplifier circuit may include first and second resistance to voltage converters, a bit-line sense amplifier and a precharge circuit. Therefore, the resistive type memory device 812 may enhance performance by obtaining enough sensing margin without regard to variance of process and signals without generating extra reference current or reference voltage and may increase integration rate due to simple configuration.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Although a system includes a separate storage unit for storing a large amount of data such as a cache memory or a RAM having a high processing speed, these memories may be replaced by one resistive type memory system of the present disclosure. Accordingly, since a large amount of data may be rapidly stored in a resistive type memory device, a computing system may have a simple structure.

Figure 28:
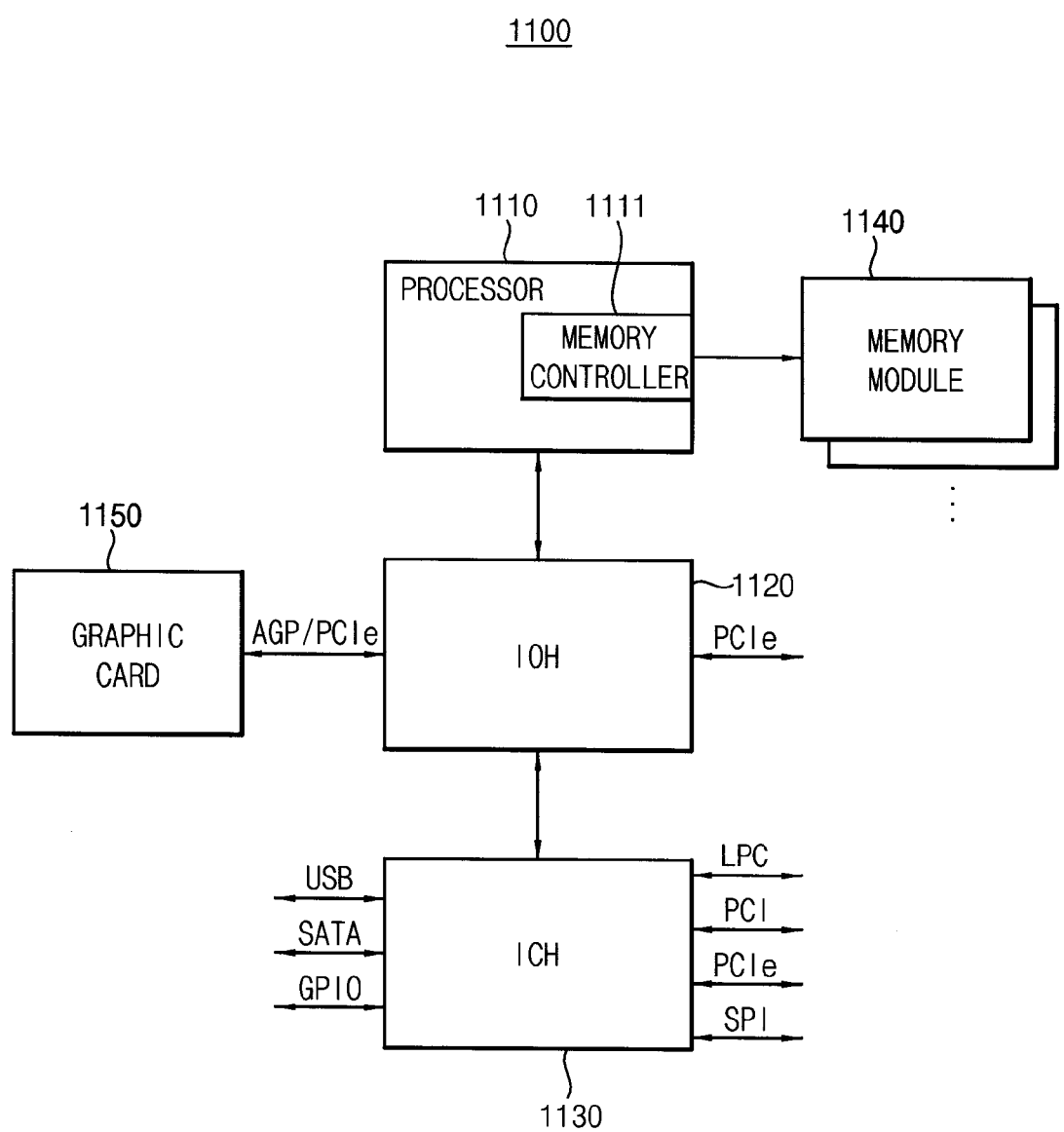
FIG. 28 is a block diagram illustrating a computing system including a resistive type memory device according to example embodiments.

FIG. 28 is a block diagram illustrating a computing system including the resistive type memory device according to example embodiments.

Referring to FIG. 28, a computing system 1100 may include a processor 1110, an input/output hub (IOH) 1120, an input/output controller hub (ICH) 1130, at least one memory module 1140 and a graphics card 1150. In some embodiments, the computing system 1100 may be an electronic device such as a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of resistive type memory devices that store data provided from the memory controller 1111. Each of the plurality of resistive type memory devices may include STT-MRAM cells and a sense amplifier circuit that sense data in the STT-MRAM cells. The sense amplifier circuit may include first and second resistance to voltage converters, a bit-line sense amplifier and a precharge circuit. Therefore, each of the resistive type memory devices may enhance performance by obtaining enough sensing margin without regard to variance of process and signals without generating extra reference current or reference voltage and may increase integration rate due to simple configuration.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 21 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal resistive type memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The present disclosure may be applied to systems using a system using a resistive type memory device. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A memory core of a resistive type memory device, the memory core comprising:
   a bit line;
   at least a first resistive type memory cell coupled to the bit-line at a first node;
   a first resistance to voltage converter coupled to the bit-line at the first node, the first resistance to voltage converter configured to convert a resistance of the first resistive type memory cell to a corresponding voltage based on a read column selection signal; and
   a bit-line sense amplifier coupled to the bit-line at the first node and coupled to a complementary bit-line at a second node, the bit-line sense amplifier configured to sense and amplify a voltage difference of the bit-line and the complementary bit-line in response to a sensing control signal.

2. The memory core of claim 1, wherein the first resistive type memory cell comprises:
   a magnetic tunnel junction (MTJ) element that has a first terminal coupled to the bit-line; and
   a cell transistor that has a first electrode coupled to a second terminal of the MJT element, a gate terminal coupled to a word-line and a second electrode coupled to a source line.

3. The memory core of claim 1, wherein the first resistance to voltage converter comprises:
   a first n-channel metal oxide semiconductor (NMOS) transistor coupled to the bit-line;
   a third NMOS transistor coupled to a ground line; and
   a second NMOS transistor coupled between the first NMOS transistor and the third NMOS transistor.

4. The memory core of claim 3, wherein the first through third NMOS transistors are coupled in series with respect to each other between the bit-line and the ground line, the first NMOS transistor has a gate receiving the read column selection signal, the third NMOS transistor has a gate receiving a bias voltage and the second NMOS transistor is diode-connected.

5. The memory core of claim 4, wherein the second NMOS transistor operates in a saturation region when the first NMOS transistor is turned-on in response to the read column selection signal.

6. The memory core of claim 1, wherein the first resistance to voltage converter comprises:
   a first p-channel metal-oxide semiconductor (PMOS) transistor coupled to the bit-line;
   a third PMOS transistor coupled to a power supply voltage line; and
   a second PMOS transistor coupled between the first PMOS transistor and the third PMOS transistor.

7. The memory core of claim 6, wherein the first through third PMOS transistors are coupled in series with respect to each other between the bit-line and the power supply voltage line, the first PMOS transistor has a gate receiving an inverted version of the read column selection signal, the third PMOS transistor has a gate receiving a bias voltage and the second PMOS transistor is diode-connected.

8. The memory core of claim 7, wherein the second PMOS transistor is configured to operate in a saturation region when the first PMOS transistor is turned-on in response to the inverted version of the read column selection signal.

9. The memory core of claim 1, further comprising:
   a precharge circuit coupled between the first node and the second node in parallel with the bit-line senses amplifier, the precharge circuit configured to precharge the bit-line and the complementary bit-line to a precharge voltage level during precharge interval, in response to a first precharge control signal and a second precharge control signal.

10. The memory core of claim 9, wherein the precharge circuit comprises:
    a first p-channel metal-oxide semiconductor (PMOS) transistor coupled between the first node and a third node connected to a precharge voltage;
    a second PMOS transistor coupled between the third node and the second node; and
    a third PMOS transistor coupled between the first node and the second node in parallel with the first PMOS transistor and the second PMOS transistor;
    wherein the first precharge control signal is configured to be applied the first PMOS transistor and a gate of the third PMOS transistor and the second precharge control signal is configured to be applied to a gate of the second PMOS transistor;
    wherein the second precharge control signal is configured to transition to an active level simultaneously with the first recharge control signal, and wherein an activation interval of the second precharge control signal is longer than an activation interval of the first recharge control signal.

11. The memory core of claim 1, wherein the bit-line sense amplifier comprises:
    a first p-channel metal-oxide semiconductor (PMOS) transistor coupled between the first node and a third node;
    a second PMOS transistor coupled between the second node and the third node;
    a third PMOS transistor coupled between the third node and an internal power supply voltage;
    a first n-channel metal-oxide semiconductor (NMOS) transistor coupled to the first node and a fourth node;
    a second NMOS transistor coupled to the second node and the fourth node; and
    a third NMOS transistor coupled to the fourth node and a ground voltage, and
    wherein a gate of the first PMOS transistor and a gate of the first NMOS transistor are commonly coupled to the second node and a gate of the second PMOS transistor and a gate of the second NMOS transistor are commonly coupled to the first node.

12. The memory core of claim 1, further comprising:
    at least a second resistive type memory cell coupled to the complementary bit-line at the second node; and
    a second resistance to voltage converter coupled to the complementary bit-line at the second node, the second resistance to voltage converter configured to convert a resistance of the second resistive type memory cell to a corresponding voltage based on the read column selection signal.

13. A resistive type memory device comprising:
    a memory cell array including a plurality of sub array blocks and a plurality of bit-line sense amplifier regions disposed adjacent to the plurality of sub array blocks such that the plurality of sub array blocks and plurality of bit-line sense amplifier regions are alternatingly arranged,
    wherein at least one of the sub array blocks comprises:
    at least a first resistive type memory cell coupled to a bit-line; and at least a second resistive type memory cell coupled to a complementary bit-line, and wherein one of the plurality of bit-line sense amplifier regions includes:

a first resistance to voltage converter coupled to the bit-line at a first node coupled to the first resistive type memory cell, the first resistance to voltage converter configured to convert a resistance of the first resistive type memory cell to a corresponding voltage based on a read column selection signal; and a bit-line sense amplifier coupled to the bit-line at the first node and coupled to a complementary bit-line at a second node, the bit-line sense amplifier configured to sense and amplify a voltage difference between the bit-line and the complementary bit-line in response to a sensing control signal.

14. The resistive type memory device of claim 13, wherein the first resistive type memory cell and the second resistive type memory cell are respectively disposed in two different sub array blocks of the plurality of sub array blocks, the two different sub array blocks adjacent to and at opposite respective sides of the bit-line sense amplifier.

15. The resistive type memory device of claim 13, wherein the first resistive type memory cell and the second resistive type memory cell are disposed in one sub array block adjacent to the bit-line sense amplifier, of the plurality of sub array blocks.

16. The resistive type memory device of claim 13, wherein one of the plurality of bit-line sense amplifier regions further includes:

a second resistance to voltage converter coupled to the complementary bit-line at the second node, the second resistance to voltage converter configured to convert a resistance of the second resistive type memory cell to a corresponding voltage based on the read column selection signal.

17. The resistive type memory device of claim 13, wherein the first resistive type memory cell comprises:

a magnetic tunnel junction (MTJ) element that has a first terminal coupled to the bit-line; and a cell transistor that has a first electrode coupled to a second terminal of the MJT element, a gate terminal coupled to a word-line and a second electrode coupled to a source line.

18. The resistive type memory device of claim 13, further comprising:

a precharge circuit coupled between the first node and the second node in parallel with the bit-line sense amplifier, the precharge circuit configured to precharge the bit-line and the complementary bit-line to a precharge voltage level during precharge interval, in response to a first precharge control signal and a second precharge control signal.

19. A method of sensing data in a resistive type memory device, the method comprising:

precharging a bit-line and a complementary bit-line, wherein the bit-line is coupled to at least a first resistive type memory cell and the complementary bit-line is coupled to at least a second resistive type memory cell;

enabling a selected word-line coupled to the first resistive type memory cell;

activating a read column selection signal to convert a resistance to a corresponding voltage of the first resistive type memory cell; and sensing and amplifying the converted voltage using a bit-line sense amplifier to determine data stored in the first resistive type memory cell.

20. The method of claim 19, wherein each of the first resistive type memory cell and the second resistive type memory cell is a spin transfer torque magneto-resistive random access memory (STT-MRAM) cell that includes a magnetic tunnel junction (MTJ) element and a cell transistor.

* * * * *